US005543670A

United States Patent [19]
Luecke

[11] Patent Number: 5,543,670
[45] Date of Patent: Aug. 6, 1996

[54] MAGNETOSTRICTIVE ACTUATOR FOR OPTICAL ALIGNMENT SCREWS

[75] Inventor: Francis S. Luecke, San Jose, Calif.

[73] Assignee: New Focus, Inc., Santa Clara, Calif.

[21] Appl. No.: 394,451

[22] Filed: Feb. 27, 1995

Related U.S. Application Data

[63] Continuation-in-part of Ser. No. 191,089, Feb. 3, 1994, Pat. No. 5,394,049, which is a continuation-in-part of Ser. No. 43,263, Apr. 6, 1993, Pat. No. 5,410,206.

[51] Int. Cl.⁶ .............................. H01L 41/12; H02N 2/00
[52] U.S. Cl. .............................................. 310/26; 318/116
[58] Field of Search ...................................... 310/317, 328, 310/26; 318/116

[56] References Cited

U.S. PATENT DOCUMENTS

| | | | |
|---|---|---|---|
| 4,019,073 | 4/1977 | Vishnevsky et al. | 310/328 |
| 4,613,782 | 9/1986 | Mori et al. | 310/323 |
| 4,918,351 | 4/1990 | Kawai | 310/323 |
| 5,059,850 | 10/1991 | Yoshimura et al. | 310/323 |

FOREIGN PATENT DOCUMENTS

| | | | |
|---|---|---|---|
| 0698079 | 11/1979 | U.S.S.R. | 318/116 |
| 0739671 | 6/1980 | U.S.S.R. | 318/116 |

Primary Examiner—Thomas M. Dougherty
Attorney, Agent, or Firm—Hugh D. Jaeger

[57] ABSTRACT

This invention relates to electromechanical actuators, and particularly to actuators utilizing magnetostrictive elements to rotate positioning shafts associated with optical elements.

19 Claims, 29 Drawing Sheets

MAGNETOSTRICTIVE ACTUATOR FOR OPTICAL ALIGNMENT SCREWS

CROSS REFERENCES TO CO-PENDING APPLICATIONS

This patent application is a continuation-in-part of Ser. No. 08/191,089, filed Feb. 3, 1994, now U.S. Pat. No. 5,394,049, which is a continuation-in-part of Ser. No. 08/043,263, filed Apr. 6, 1993, now U.S. Pat. No. 5,410,206, and assigned to the same assignees.

BACKGROUND OF THE INVENTION

1. Field of the Invention

This invention relates to electromechanical actuators, and particularly to actuators utilizing magnetostrictive elements to rotate positioning shafts associated with optical elements. This invention also relates to electromechanical actuators, and particularly to actuators using magnetostrictive elements to rotate optical stages.

2. Description of the Prior Art

The bench setups used in experimental optics frequently incorporate individual optical elements, such as lenses, filters, mirrors, radiation sources and radiation detectors, which are mounted on adjustable supports. Such supports may be capable of both lateral and vertical adjustment to properly position the element within the optical System. Additionally, some form of tilt (axial orientation) adjustment is provided for properly orienting the element with respect to the optical axis of the system.

While the particular form of the tilt adjustment varies according to the nature of the optical element and the precision required, a common form of adjustable mount is a three screw device, such as the Model 9809 sold by New Focus, Inc. of Mountain View, Calif., and described in U.S. Pat. No. 5,140,470, entitled "Optical Mounting Apparatus" issued to Francis S. Luecke and assigned to New Focus, Inc., the assignee of this invention. This mount, and other similar mounts sold by New Focus, £nc., has three ¼—80 adjustment screws arranged in a triangular configuration for tilting the optical element held by the mount. The adjustment screws in this device are provided with knurled knobs for manual adjustment.

These mounts have been highly successful and are widely used in experimental optical setups. They provide excellent stability and accommodate ease of adjustment. These mounts also facilitate use in a vacuum and other environments such as unsafe, inconvenient or those environments hostile to scientists, or where the mount can't be reached. Nevertheless, it would be desirable to avoid even the slight deflection of the optical element which results from manual adjustment of the mount. Further, certain experimental optical setups may occupy a large space, and make manual adjustment of the mounts located in the interior portions of the optical bench more awkward than desirable. In addition, it is usually desirable to make dynamic adjustments on the system; that is, while the system is in actual operation. This introduces an element of danger with systems incorporating lasers, since inadvertent exposure to laser radiation may permanently damage eyesight or other parts of the human body.

Despite the disadvantages inherent in the use of manual adjustment screws, the use of electrically driven actuators has been limited by cost, size and stability considerations. These limitations have limited the use of remotely controlled actuators to particular optical elements, wherein the optical element and the actuator are interrelated and the actuator is totally dedicated to the single element. While this approach is frequently satisfactory in a finished optical system, it is unduly cumbersome and expensive in experimental setups.

It has been recognized that piezoelectric systems are well suited for mechanically driving the positioning shafts in an optical system. For example, U.S. Pat. No. 4,622,483 to Staufenberg and Hubbell is descriptive of a system which utilizes piezoelectric elements to alternatively clamp and drive a mechanical element such as shaft.

U.S. Pat. No. 4,727,278 to Staufenberg describes a piezoelectric multi-axis positioner for rotation of a sphere which supports an optical element. The tilt systems described therein are limited to spherical mounts, and do not lend themselves to use with universal mounts such as the New Focus Model 9809.

Still another piezoelectric driven system is shown in U.S. Pat. No. 4,831,306 to Staufenberg and Hubbell. In this system, a piezoelectric element mounted within an annular housing is energized in a fashion, whereby an engaging member is driven with a first polarity signal to cause engagement with an output shaft, and then driven with a second polarity signal to withdraw the member from engagement with the output shaft. Piezoelectric devices have been used for other purposes such as that described by L. Howald, H. Rudin and H. J. Guntherodt in "Piezoelectric inertial stepping motor with spherical rotor", Review of Scientific Instruments 63 (8) August 1992 p. 3909–3912. The publication describes a system in which a plurality of inertial piezoelectric actuators are used to position a polished steel sphere which may support an optical element. In the system described by the publication, the actuators are driven slowly in one direction and abruptly in the opposite direction. Friction causes the polished ball to follow the slow actuator movement but inertia prevents the ball from following the abrupt actuator movement.

A publication by John D. Skipper, "Piezoelectric Traction Motor Delivers High Torque, High Power at Low Speed" in PCIM, June 1992, p. 36–39, describes a piezoelectric motor having a rotary output shaft. This publication describes the difficulty of coupling piezoelectric devices to a rotary output shaft due to the very small mechanical movement of the piezoelectric device.

A Newport rotary stage Model 481-A is designed to be positioned by means of a manually operated side-mounted thumbscrew including a worm screw which engages a worm gear on the rotary stage. Newport rotary stages such as the RSX and RSA series are friction driven with a small drive wheel which engages the periphery of the stage. The Model 495 motorized rotary stage incorporates a motor driven worm screw in contact with the worm gear affixed to the rotatable stage.

SUMMARY OF THE INVENTION

The general purpose of the present invention is to provide a low cost magnetostrictive actuator having a single magnetostrictive element mounted in a frame element of simple design having a pair of abutting jaw elements which are adapted to fit about the threaded shaft to be driven. The magnetostrictive element is operative to effect reciprocating motion of the abutting jaw elements in parallel paths. The reciprocating motion of the jaw elements against the driven output shaft held therebetween is converted to simple rotary motion by moving the jaws relatively slowly in a first direction such that the coefficient of friction between the shaft and the jaws overcomes inertia of the shaft. Engagement is maintained between the jaws and the shaft to incrementally rotate the shaft. Motion of the jaws in the second direction is relatively fast, such that the inertia of the output shaft prevents it from following the jaw motion and the shaft slips in the jaws, preserving the preceding incremental motion. The result is a stepwise rotation of the output shaft. Rotational motion of the shaft in the reverse direction is accomplished by simply interchanging the speeds of the motion in the first and second directions.

The maximum width of the device need be only slightly greater than the diameter of the output shaft. Since the output shaft is typically 0.25 inches, the maximum width can be easily kept under 0.5 inches. The length of the device needed to drive a 0.25 inch output shaft need be no more than 1.0 inch and the thickness can be less than 0.3 inches, providing an exceptionally compact unit.

Since the device accommodates an external drive shaft, it is easily added to an existing mount with a simple engagement pin or clamp to prevent the actuator from rotating relative to the optical mount which supports the adjustment screw. The device can be added to existing optical mounts by simply removing the adjustment screw, threading it between the jaws of the device, reinserting the screw into the mount, and fixing the position of the device relative to the mount.

Due to the simplicity of the design and the ease of fabrication from conventional materials, the device is inexpensive to manufacture.

Because of the small size of the device, it can be used in crowded, complex, optical setups without requiring compromises in the optical system.

By using the inertial characteristics of the output shaft to avoid rotation in the direction opposite from that desired, the device eliminates the requirement for piezoelectric elements which clamp the output shaft. This greatly reduces both the size and the complexity of the system, as well as the associated electronics.

Since the device does not depend on mechanical resonance of the system, it can provide a wide range of output speeds and movement. Bi-directional rotation in he range of 2–3 RPM is easily achieved with a 0.25 inch output shaft. Since a single step of the actuator provides approximately 1 minute of rotational shaft movement, very precise positioning of the optical element is available on the order of 0.02 micrometers. This is substantially more precise than can be reliably obtained with manual adjustment techniques. In addition, since the device is remotely controlled, the optical experimenter can easily monitor the effect of the adjustment on the optical system at a position which may be remote from the actual point of adjustment.

In the rotatable optical stage embodiment, bi-directional rotation of the stage can be achieved at speed approaching 360 degrees/minute for a 2" diameter stage. Since the magnetostrictive actuator motion is relatively small, positioning within 0.1 radian is easily achieved. Even more accuracy is obtainable by reducing the amplitude of the electrical drive signals applied to the piezoelectric actuator.

Because the magnetostrictive actuator serves as a brake, i.e., retention means and clamp, when it is not energized with the electrical drive signal, the need for a separate clamp device is eliminated.

Further, since the clamping force of the magnetostrictive actuator is sufficient to retain the rotatable stage in position against slight forces applied to the rotatable stage but may be overcome manually, the option of rapid, manual, coarse positioning for initial setup is preserved.

While certain of these advantages can be individually found in the prior art, there is no known prior art device which accomplishes bi-directional rotation of an output shaft or rotary stage with a simple design utilizing a singe magnetostrictive element in conjunction with the inertial characteristics of the output shaft or rotary stage.

It is an object of the invention to provide a small, low cost and reliable magnetostrictive actuator suitable for use in speedily and accurately positioning a rotary stage for mounting optical elements.

Another object of the invention is to provide a bi-directional magnetostrictive drive system for an output shaft or rotary stage in which only one magnetostrictive element is required.

Still another object of the invention is to provide a bi-directional magnetostrictive drive system for a rotary optical stage which does not utilize a magnetostrictive clamping device and therefore requires but a single magnetostrictive element.

It is further object of the present invention to provide a magnetostrictive actuator for an adjustable optical mount which can be controlled with a conventional, two-axis joystick device of the type commonly used to play computer games.

Still another object of the present invention is to provide a magnetostrictive actuator system for a three screw optical mount, which accommodates control signals developed from a conventional two-axis joystick device to move individual adjustment shafts of an optical mount, and various combinations of the adjustment shafts, including simultaneous motion of all the adjustment shafts.

Yet still another object of the present invention is to provide a magnetostrictive actuator for the adjustment screws of an optical mount to tilt the mount in any direction and to translate the mount longitudinally along the optical axis of the system incorporating the mount.

Yet still another object of the present invention is to provide a rotatable optical stage which can be remotely positioned with the application of an electrical signal applied to a magnetostrictive drive element which also serves as a clamp having characteristics which accommodate manual positioning of the rotary stage but has sufficient clamping action to otherwise retain the rotary stage in position.

The present invention also provides a low cost magnetostrictive actuator which has a single magnetostrictive element operative to effect reciprocating (bi-directional) movement of a drive pad which is in frictional engagement with the periphery of a rotatable optical stage. The reciprocating movement of the drive pad is converted into rotary motion of the optical stage by moving the drive pad relatively slowly in a first direction such that the coefficient of friction between the pad and the stage overcomes inertia of the rotary stage to incrementally rotate the stage. Motion of the drive pad in the second, opposite, direction is relatively fast such that the drive pad slips against the rotary stage, preserving the preceding incremental rotational motion. The result is a stepwise rotation of the rotary stage. Rotation of the stage in the opposite direction is accomplished by simply interchanging the speeds of motion in the first and second directions.

The rotary stage easily accommodates the magnetostrictive driver, which is very much smaller than the typical electric motor used to drive prior art rotary stages.

The engagement between the magnetostrictive driver and the rotary stage is frictional, which allows rapid, manual, coarse positioning of the stage without the need to drive the stage electrically. This is a substantial advantage over the prior art electric motor driven devices utilizing worm drives which cannot be manually positioned without driving the worm screw, a slow and tedious process at best. The device of this invention combines the fine adjustment potential of an electrically driven worm screw device and the rapid positioning capability of the frictionally drive stage without the disadvantages inherent to these devices, the lack of rapid positioning capability of the worm screw device and the lack of precision inherent in the frictionally driven device.

Because of the small size of the magnetostrictive driver, the overall size of a rotary positioning stage does not have to be greatly enlarged to accommodate the driver.

Additionally, because the inertial characteristics of the rotary stage are used to avoid rotation in the direction opposite from that desired, there is no need for additional clamp elements to restrain the stage from rotation when the magnetostrictive element is reversed and returned to the pre-drive position.

Even further, the rotational drive speed may be widely varied since the system does not depend on the mechanical resonance of any of the elements.

The system of the invention is essentially free of mechanical backlash without the requirement for elaborate preloading arrangements. This allows an optical element mounted on the rotary stage to be accurately positioned with an approach from either direction, thereby obviating the need to run the stage back beyond the desired position when the desired location is missed on the initial approach.

While certain of these advantages may be individually found in the prior art, there is no known device which accomplishes bi-directional movement of a rotary optical stage with a simple drive element utilizing a single magnetostrictive element in conjunction with the inertial characteristics of the rotary stage.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
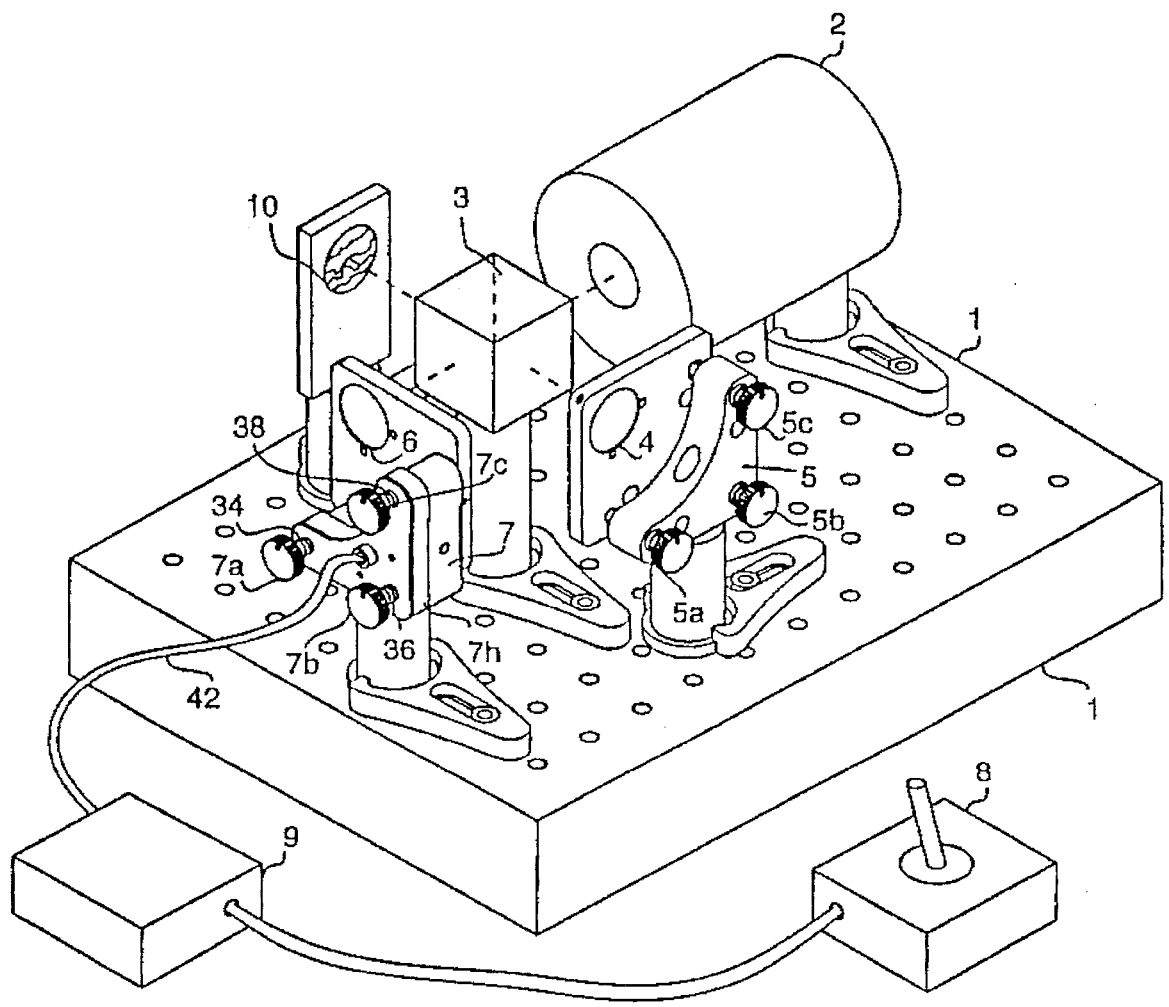
FIG. 1 is a pictorial view of a Michelson interferometer optical setup utilizing an adjustable optical mount to which has been added the piezoelectric actuators of the invention.

The Michelson interferometer optical system shown in FIG. 1 includes an optical bench 1 on which a radiation source, such as laser and beam expander 2 is mounted. The output beam of laser 2 is directed to the beam-splitting cube 3, which directs a portion of the incident beam to a reference mirror 4 positioned by a manually adjustable New Focus Model 9809 mount 5, which is affixed to optical bench 1. Another portion of the incident beam is directed to a second mirror 6, which may be under test or evaluation. The reflected beams from mirrors 4 and 6 are recombined in beam-splitting cube 3, and directed to viewing screen 10.

Fine positioning of mirror 4 is accomplished in a conventional fashion by means of the adjustment screws 5a, 5b and 5c. The adjustment screws 34, 36 and 38 of adjustable mount 7 holding test mirror 6 may be manually adjusted by means of knobs 7a, 7b and 7c in a fashion similar to mount 5. Additionally, the adjustment screws 34, 36 and 38 may be driven by piezoelectric actuators within the housing 7h in response to signals developed with the joystick control device 8. Signals from joystick control device 8 are converted into drive signals for the piezoelectric actuators by electronic controller 9. Control signals developed in response to movement of the joystick provide for individual movement of each of three adjustment screws 34, 36 and 38, as well as simultaneous movement of two screws dependent on the positioning of the joystick. The joystick also includes a "fire" button which develops a control signal, which is effective to drive all three screws simultaneously.

It will be appreciated that the representation of FIG. 1 is for the purpose of illustrating the environment in which the invention is used, and has been greatly simplified from actual setups in which the optical system is typically far more complex.

Figure 2:
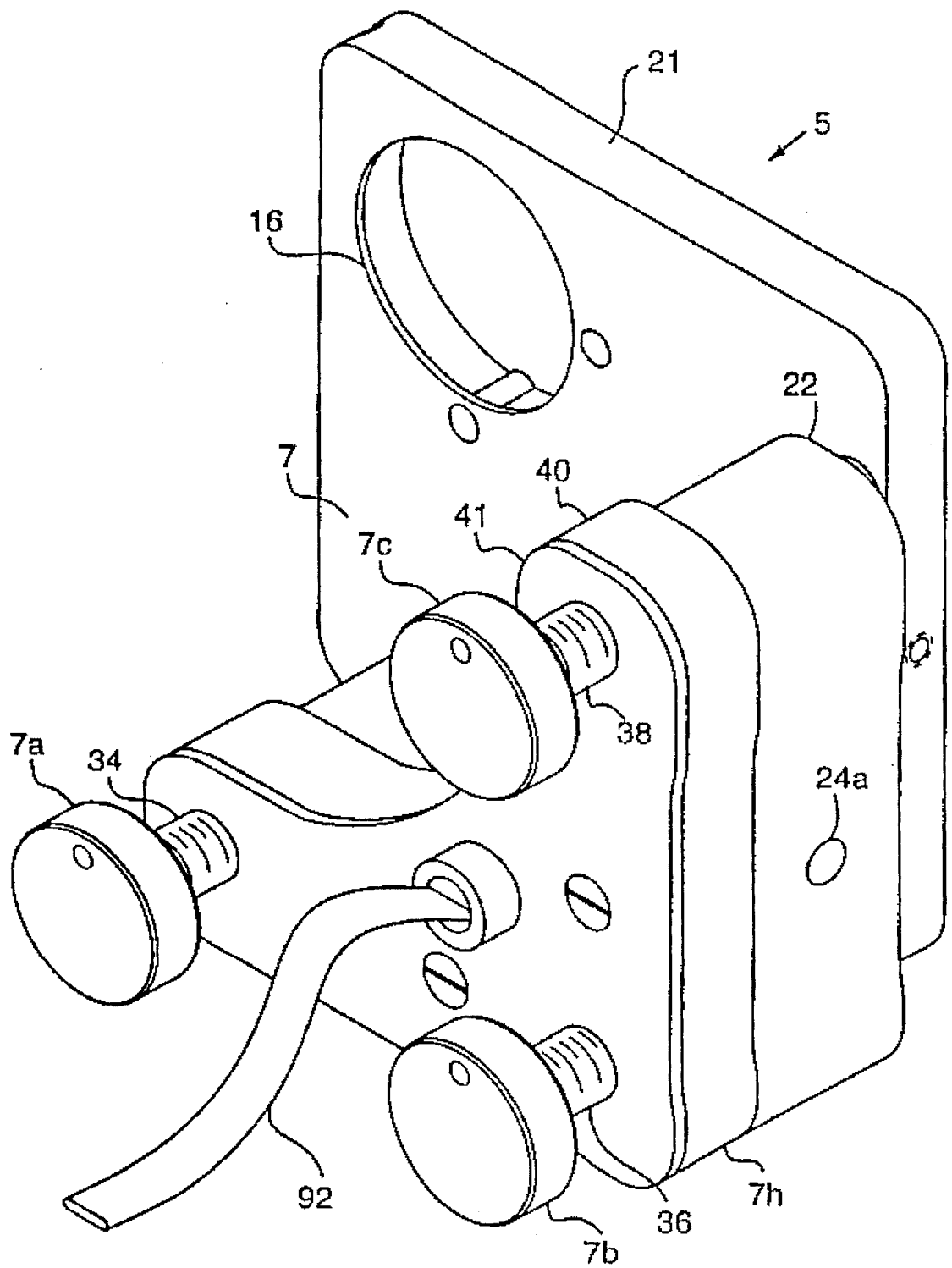
FIG. 2 is an isometric view of the housing used to contain the piezoelectric actuators of the invention.

FIG. 2 shows the optical mount 5 of FIG. 1 in more detail. The stage plate 21 has a mounting region 16 which can accommodate a lens, mirror, filter, diffraction grating, beam splitter or similar optical element. Base plate 22 includes an attachment hole on each of the flat sides, such as threaded hole 24a, which provide for mounting on a vertical support member, such as a post or threaded rod. Adjustment screws 34, 36 and 38 pass through corresponding threaded ports in base plate 22. The tips of adjustment screws 34, 36 and 38 rest in shallow receptacles in stage plate 21. Spring means positioned between adjustment screws 34 and 36, and 36 and 38, but not shown in the drawing, hold the stage plate against the tips of the adjustment screws 34, 36 and 38. Further details of the optical mount are contained in U.S. Pat. No. 5,140,470, the contents of which are incorporated herein by reference.

The angle of stage plate 21 relative to base plate 22, and therefore the rest of the optical system, may be altered by rotation of the individual adjustment screws 34, 36, and 38, causing them to extend or retract dependent on the direction of rotation. While manual adjustment of the position of adjustment screws 34, 36 and 38 may be accomplished with the knobs at the ends of the screws, even the slightest contact with the knobs may introduce permanent or temporary displacement of the stage plate 21 and the base plate 22 relative to he rest of the optical system. To allow the angle of the stage plate 21 to be adjusted without human physical or manual contact with the adjustment screws 34, 36 and 38, piezoelectric actuators are mounted within the actuator housing 40, which is affixed to base plate 22. Each adjustment screw has an associated piezoelectric actuator which can be energized with a drive signal to cause rotation of the screw in either direction. The drive signals developed by electronic controller 9 in response to movement of joystick control device 8 are conveyed to the piezoelectric actuators by means of the cable 42 which passes through the actuator housing cover 41.

Figure 3:
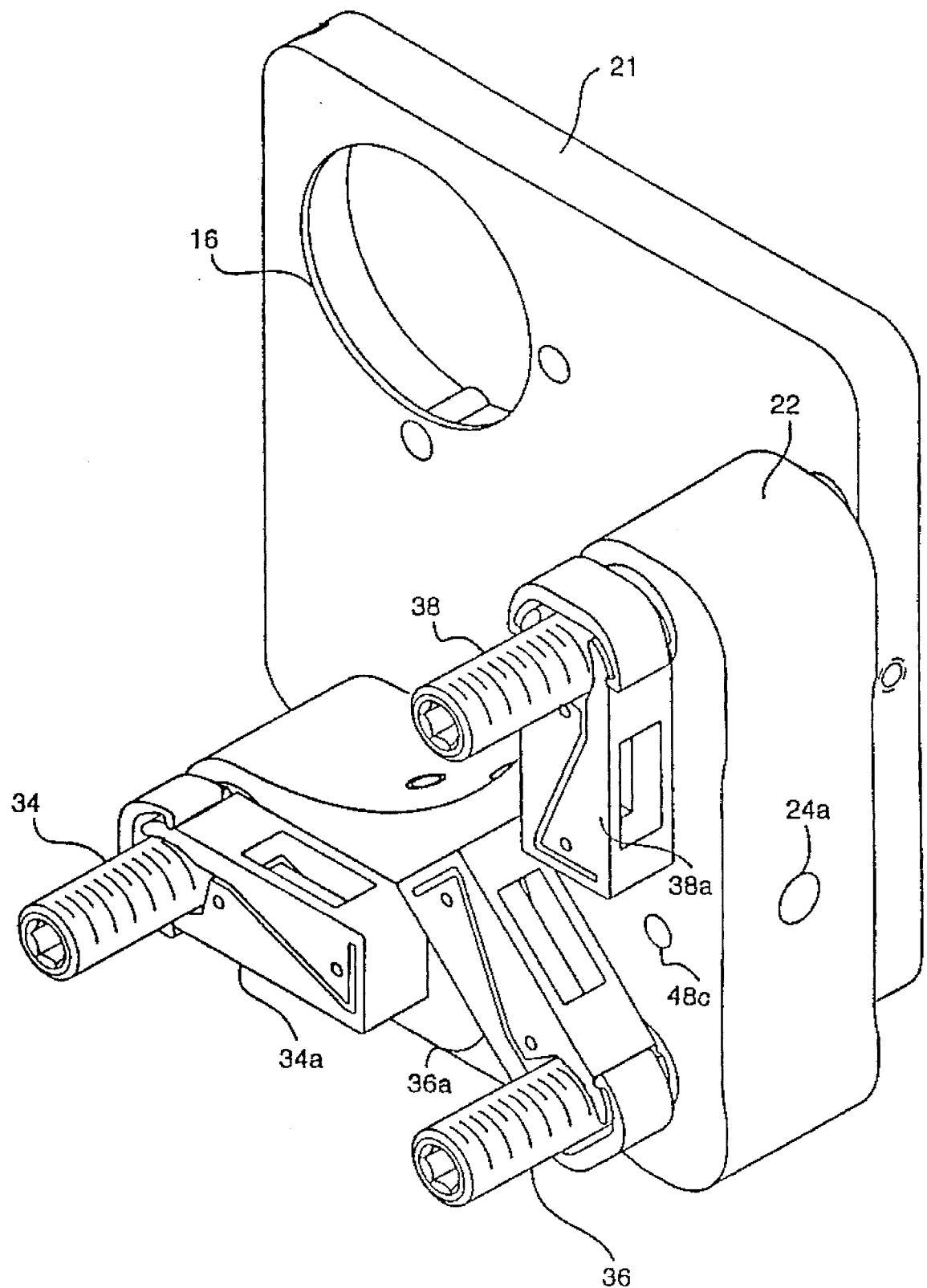
FIG. 3 is an isometric view of the optical mounting apparatus showing the placement of the piezoelectric drivers on the positioning screws.

FIG. 3 shows the optical mount with actuator housing 40 and cover 41 removed, revealing the piezoelectric actuators 34a, 36a and 38a mounted on adjustment screws 34, 36 and 38, respectively.

Figure 4:
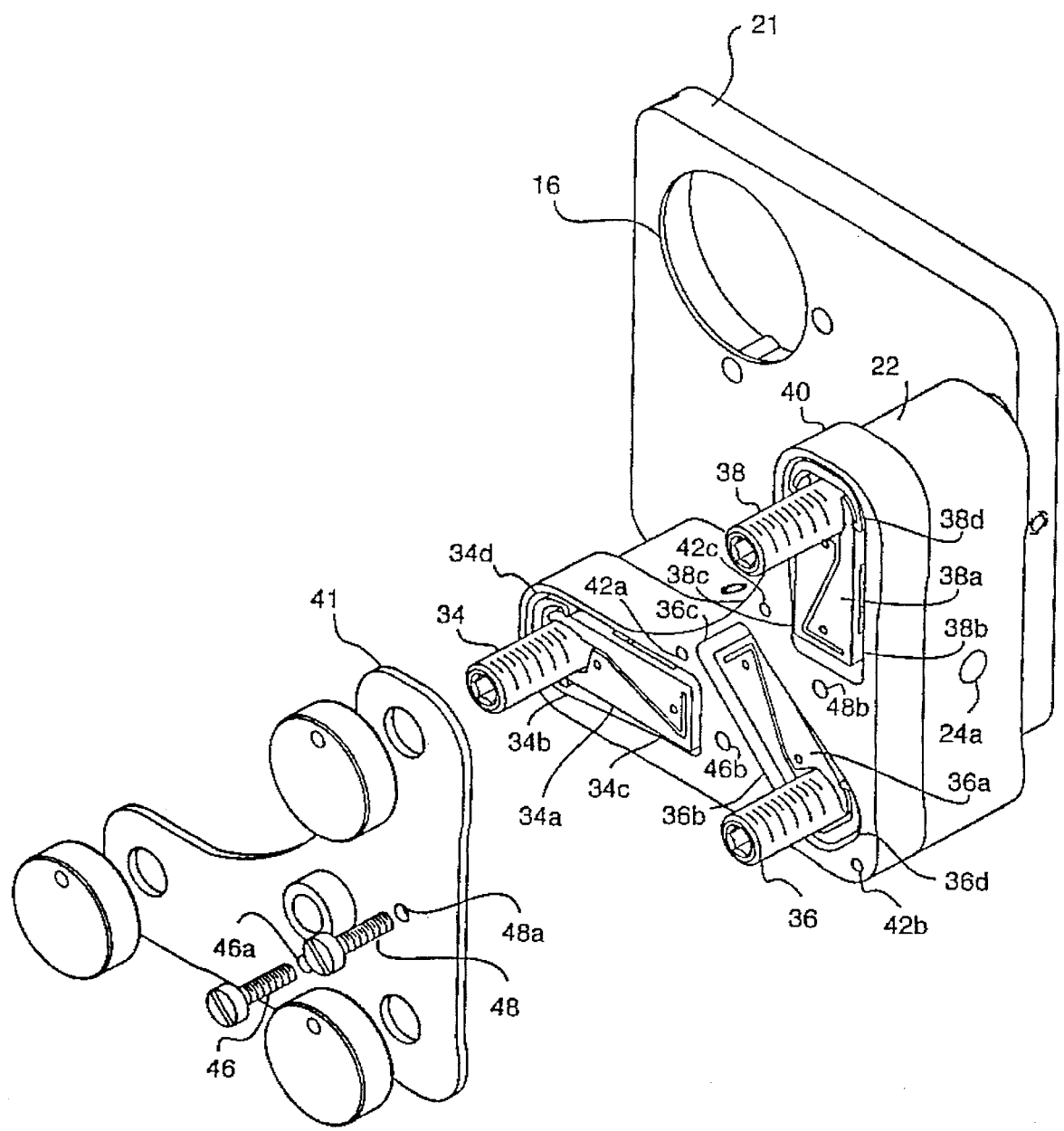
FIG. 4 is an isometric exploded view showing the retention housing for the piezoelectric actuators and the cover plate for the housing.

FIG. 4 is an exploded view illustrating piezoelectric actuators 34a, 36a and 38a in place within apertures 34b, 36b and 38b in actuator housing 40. The piezoelectric actuators are a snug fit with the apertures in the regions 34c, 36c and 38c to prevent rotational movement of the actuator relative to the housing. The apertures are slightly larger than the actuators in the regions 34d, 36d and 38d to accommodate the driving movement of the piezoelectric actuators.

Cover 41 is accurately indexed with respect to actuator housing 40 by means of locator pins, not shown, on the lower surface of cover 41 which pass into index holes 42a, 42b and 42c. Mounting screws 46 and 48 pass through clearance holes 46a and 48a, respectively, in cover 41, and clearance holes 46b and 48b, respectively, in actuator housing 40, to enter threaded holes 46c, not shown, and 48c, not shown, in base plate 22. When mounting screws 46 and 48 are tightened, the actuator housing 40 is securely held against base plate 22, and piezoelectric actuators 34a, 36a and 38a are accurately positioned and held to prevent rotation when they are energized with drive signals.

Figure 5:
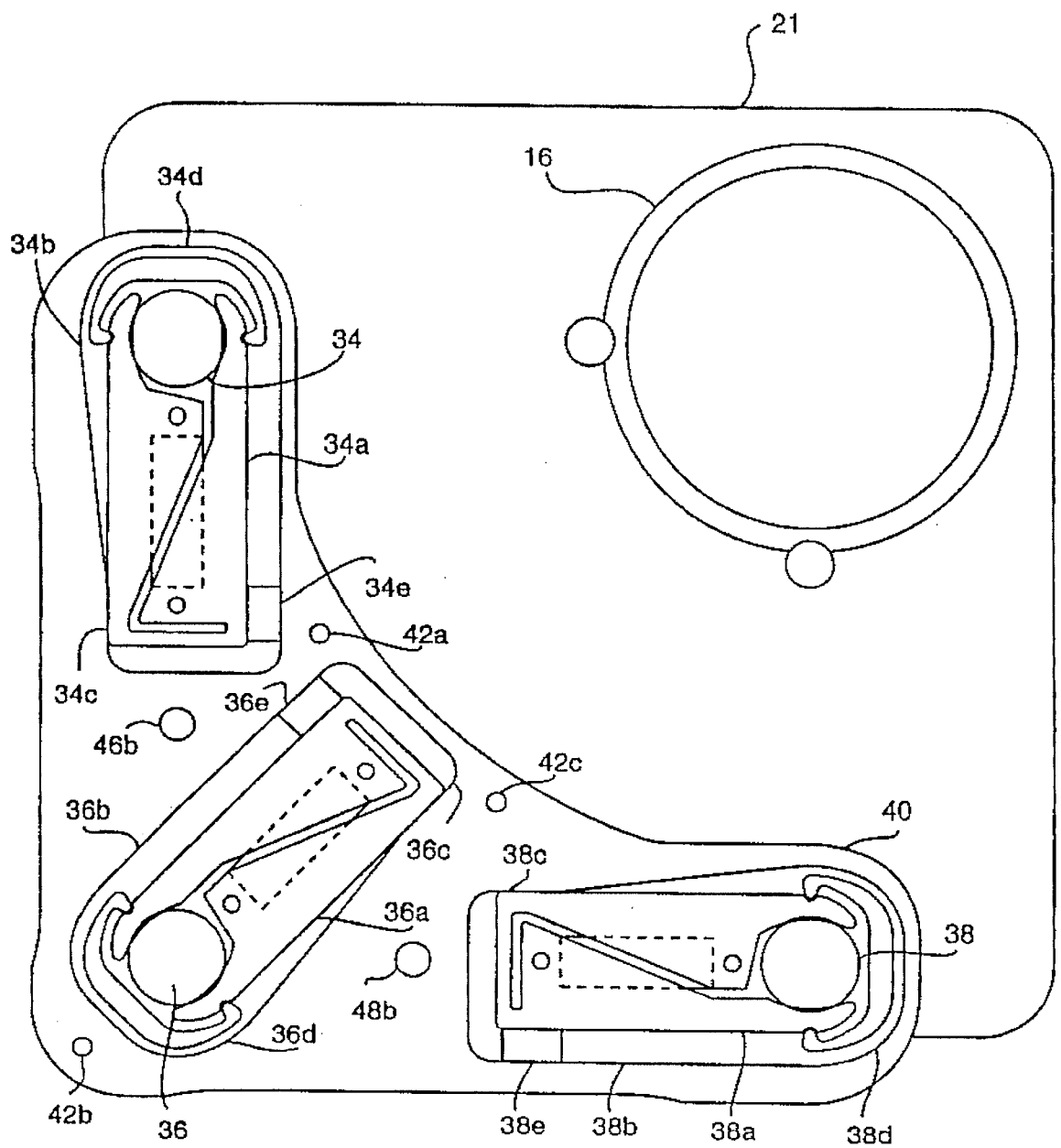
FIG. 5 is a plan view of the retention housing with the piezoelectric actuators positioned within the retention sockets.

FIG. 5 is a top plan view of the mount with cover 41 removed. All reference characters are the same as used to denote elements in the previous views. Resilient pads 34e, 36e and 38e of elastomeric material are positioned between the walls of the actuator housing 40 in the region 34c, 36c and 38c to prevent the actuators 34a, 36a and 36a from rotating when energized. Alternatively, the pads 34e, 36e and 38e can be configured in the form of elastomeric potting compound in the same regions.

Figure 6A:
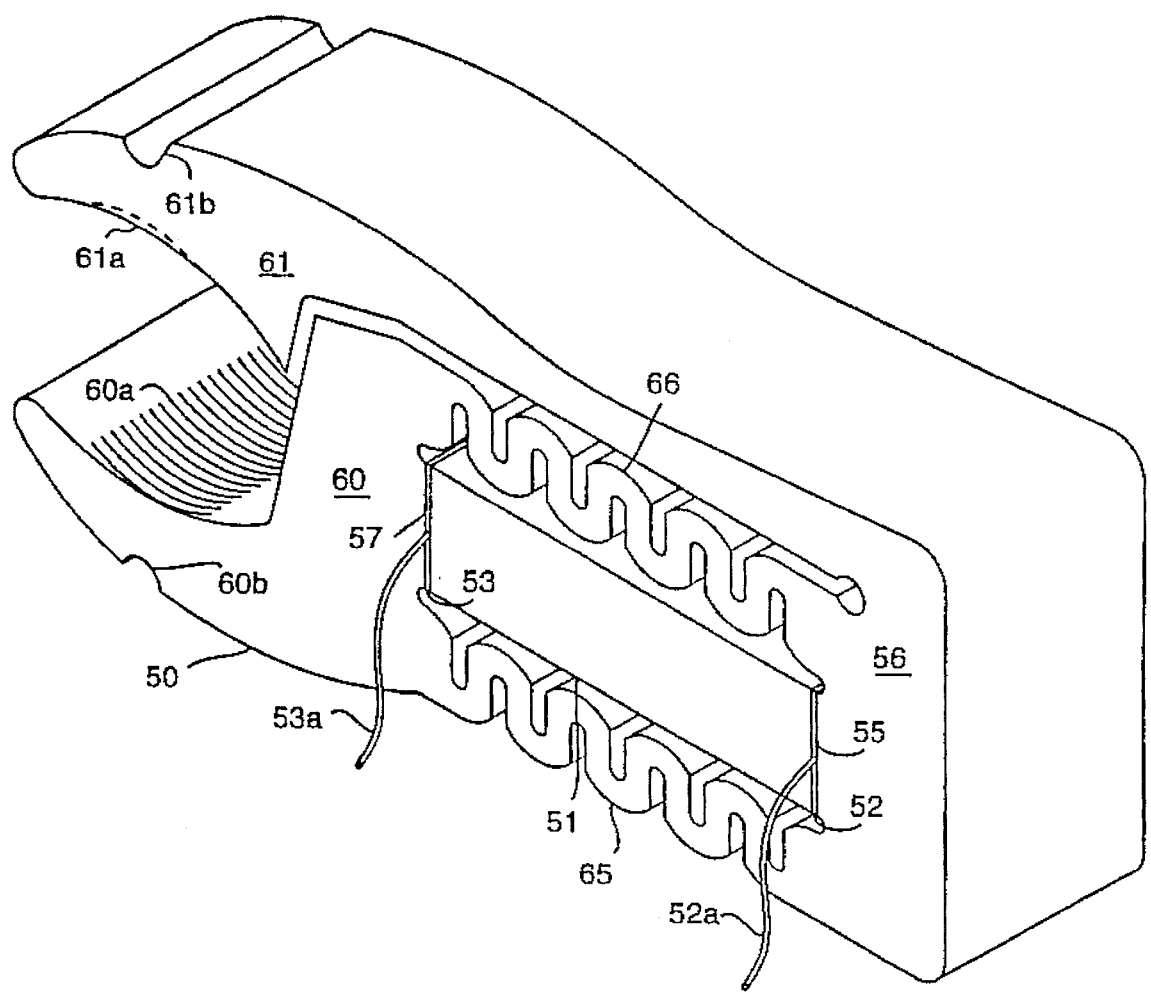
FIG. 6A is an isometric view of a piezoelectric actuator suitable for use in the invention.

The piezoelectric actuator 50 shown in FIG. 6A is an alternative to the preferred embodiment. This actuator includes a piezoelectric element 51 having electrodes 52 and 53 at opposite ends. Lead wires 52a and 53a, electrically connected to the respective electrodes, allow the drive signal to be applied across piezoelectric element 51. The drive signal causes piezoelectric element 51 to lengthen. While two electrodes are shown, the internal structure of piezoelectric element 51 may actually contain a plurality of interconnected electrodes so as to reduce the voltage required to operate the device. A first end 55 of the piezoelectric element 50 is affixed to the base portion 56 of the actuator frame (body), and an opposite end 57 is affixed to a first movable jaw element 60, which co-acts with second movable jaw element 61 to engage an adjustment screw held between the jaws. The internal faces 60a and 61a of jaws 60 and 61 are threaded to accommodate the threads of the adjustment screws which are held between the jaws.

Figure 7A:
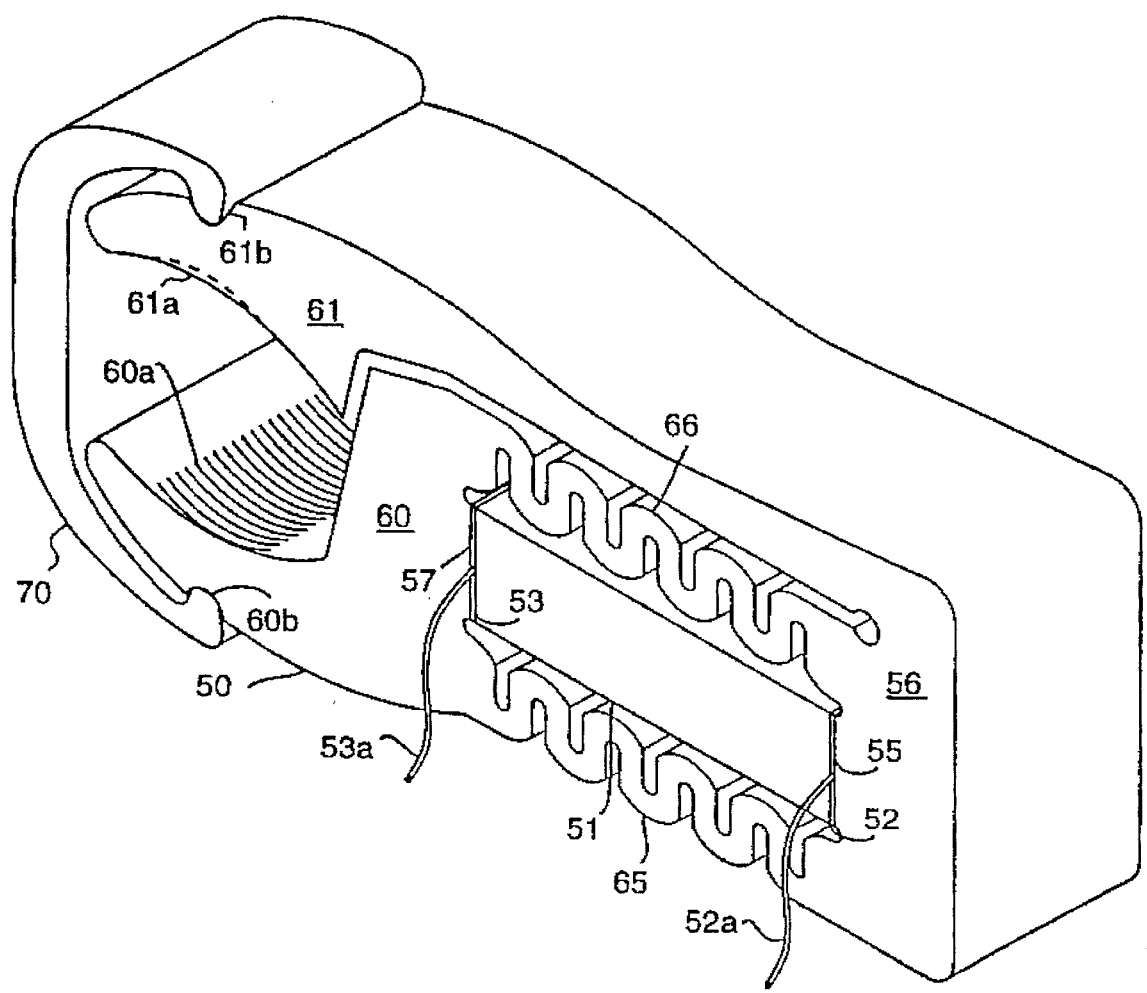
FIG. 7A is an isometric view of the piezoelectric actuator of FIG. 6a with a spring clamp in place over the open end of the device.

Resilient flexure elements 65 and 66 connect base portion 56 and first movable jaw element 60 to accommodate bi-directional lengthwise longitudinal motion of piezoelectric element 51. Such lengthwise motion of element 51 causes a longitudinal reciprocating motion of jaw elements 60 and 61, which in turn imparts a rotational motion to a cylindrical element, such as the threaded adjustment screw, held between inner faces 60a and 61a of jaws 60 and 61. A pair of spring retention grooves 60b and 61b in jaw elements 60 and 61 serve to position and retain a flat clamp spring 70, as shown in FIG. 7A, which increases the pressure of the inner faces 60a and 61a against a cylindrical element, such as a threaded adjustment screw, positioned between them. The actuator frame is fabricated from suitable brass stock by means of conventional wire electro-discharge machining techniques. Flat clamp spring 70 may be fashioned from any material having suitable spring and fatigue characteristics.

Figure 6B:
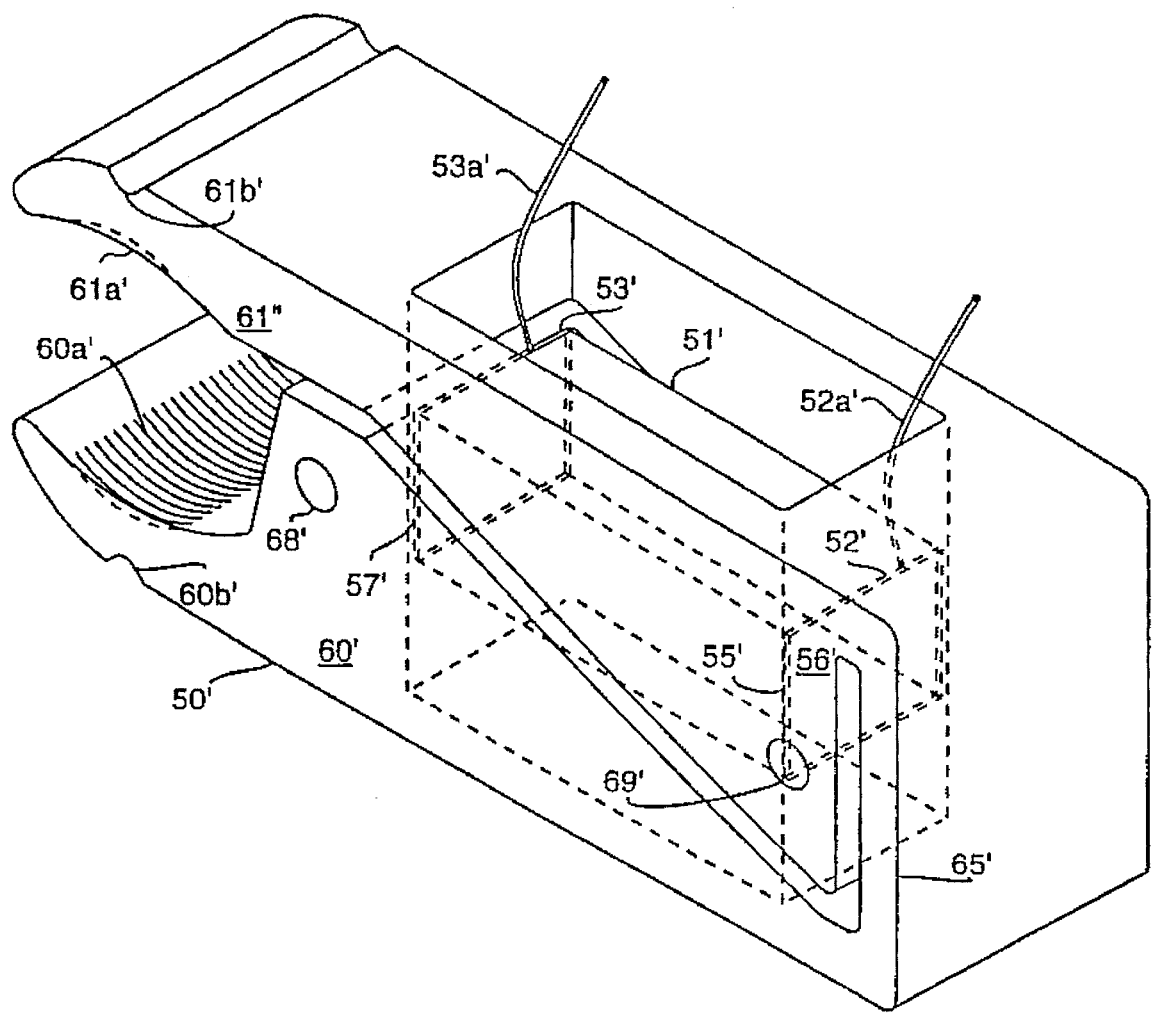
FIG. 6B is an isometric view of the preferred form of piezoelectric actuator for use in the invention.

The piezoelectric actuator 50' shown in FIG. 6B is the preferred embodiment. This actuator includes a piezoelectric element 51' having electrodes 52' and 53' at opposite ends. Lead wires 52a' and 53a', electrically connected to the respective electrodes, allow the drive signal to be applied across piezoelectric element 51'. A drive signal of a first polarity causes piezoelectric element 52' to lengthen. A first end 55' of the piezoelectric element 51' is affixed to the base portion 56' of the actuator frame (body), and an opposite end 57' is affixed to a first movable jaw element 60', which co-acts with second movable jaw element 61' to engage an adjustment screw held between the inner faces 60a' and 61a' of jaws 60' and 61'.

Figure 7B:
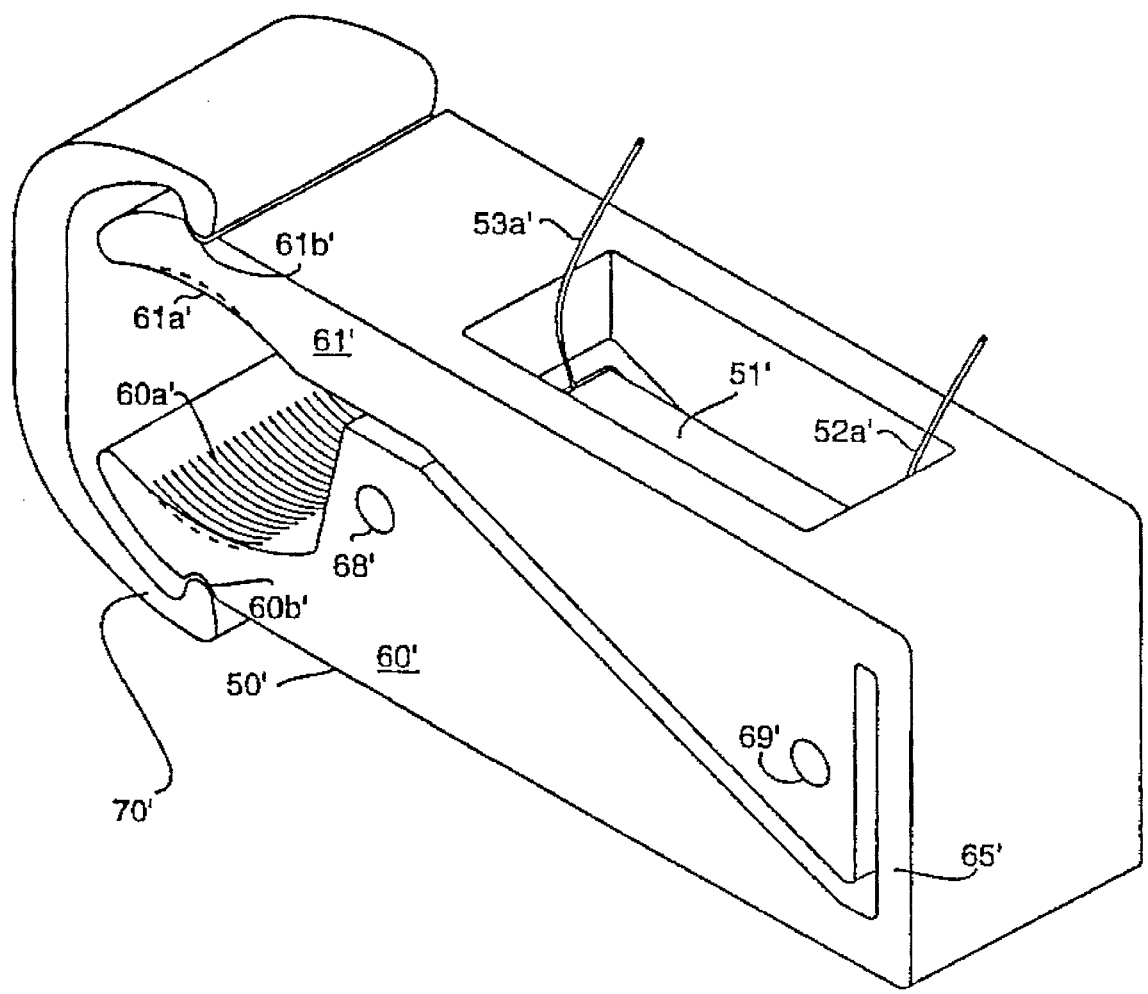
FIG. 7B is an isometric view of the piezoelectric actuator of FIG. 6b with a spring clamp in place over the open end of the device.

Resilient flexure element 65' connects base portion 56' and first movable jaw element 60' to accommodate bi-directional lengthwise longitudinal motion of piezoelectric element 51'. Such lengthwise motion of element 51' causes a longitudinal reciprocating motion of jaw elements 60' and 61', which in turn imparts a rotational motion to a cylindrical element, such as a threaded adjustment screw, held between inner faces 60a' and 61a' of jaws 60' and 61'. A pair of spring retention grooves 60b' and 61b' in jaw elements 60' and 61' serve to position and retain a flat clamp spring 70', as shown in FIG. 7B, which increases the pressure of the inner faces 60a' and 61a' against a cylindrical element, such as a threaded adjustment screw, positioned between them. The actuator frame is fabricated from suitable brass stock by means of conventional wire electro-discharge machining techniques. Flat clamp spring 70' may be fashioned from any material having suitable spring and fatigue characteristics.

Holes 68' and 69', extending through the actuator frame, are used during fabrication of the actuator to stretch the frame during cementing of the piezoelectric element 51' so that, after assembly, the piezoelectric element 51' is under compression. This is done to avoid fracturing the bond between the frame and piezoelectric element 51' when an electrical signal is applied to piezoelectric element 51'.

Figure 6C:
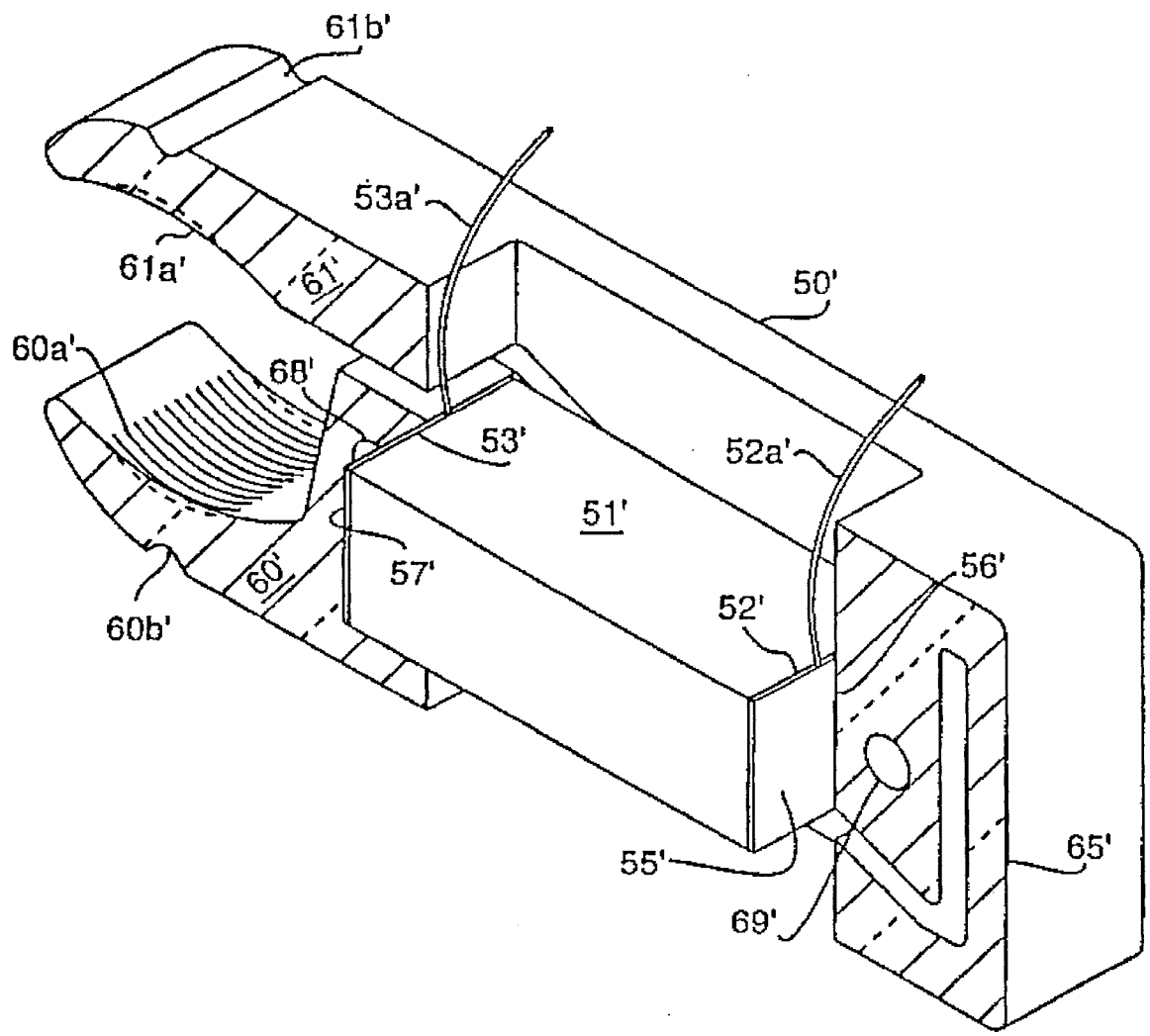
FIG. 6C is an isometric view, partially in section, of the preferred form of piezoelectric actuator for use in the invention.

FIG. 6C is a view of the preferred form of the piezoelectric actuator shown in FIG. 6B, partially in section and with parts cut away to illustrate the internal geometry of the frame. It can be seen that the aperture for the piezoelectric element extends through the actuator frame 50'. The piezoelectric element 51' is in contact with the frame only at the ends 55' and 56'.

Figure 8:
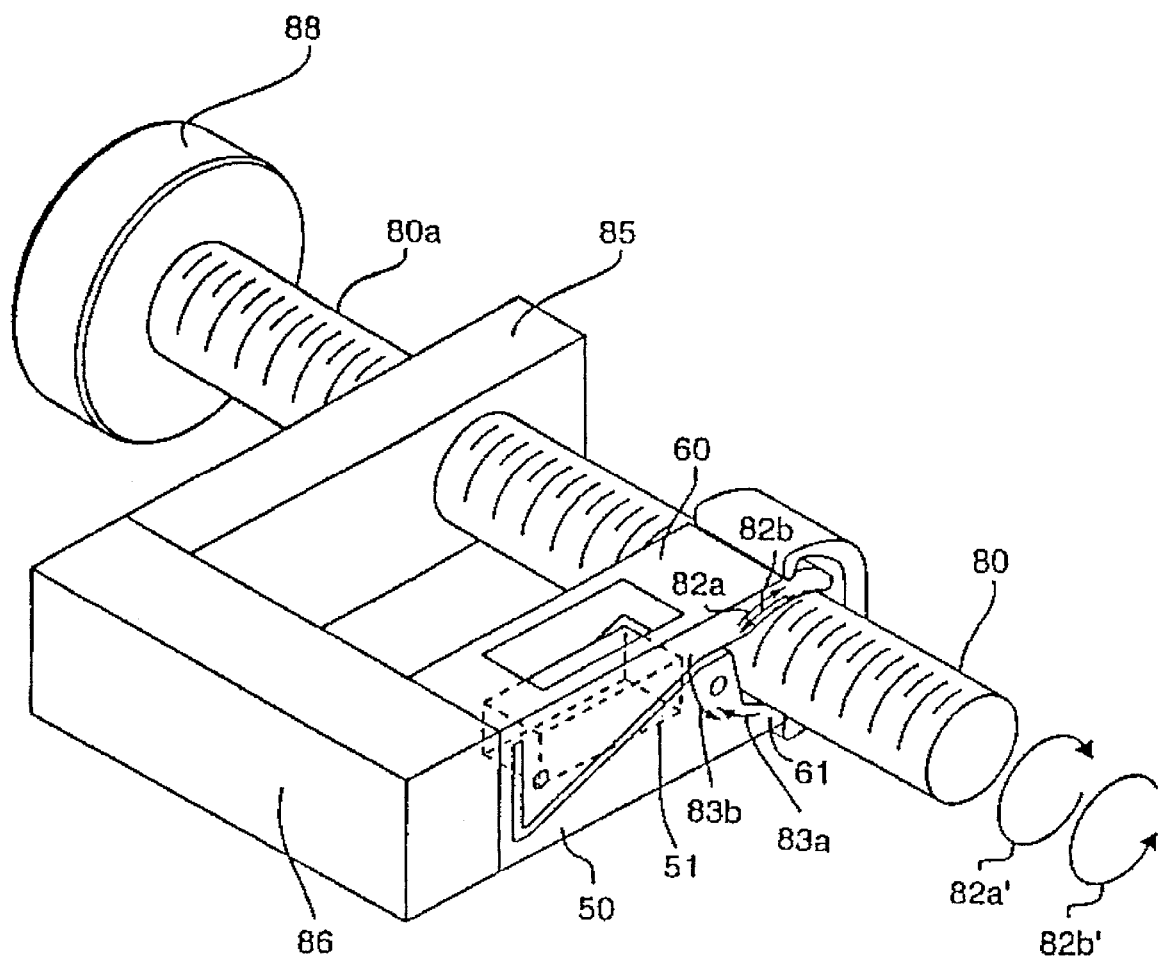
FIG. 8 is a pictorial diagram illustrating the principles governing operation of the invention.

FIG. 8 is a simplified pictorial diagram of the principal elements of the invention. Piezoelectric actuator 50 has jaw elements 60 and 61 positioned about a cylindrical shaft 80, which includes a threaded portion 80a passing through a threaded hole in base plate 85. The frame of piezoelectric actuator 50 is affixed to the base plate 85 by means of flange 86. For the purpose of this explanation, the inertial effects of the shaft 80 are represented by the flywheel 88.

When the polarity of the electrical signal across piezoelectric element 51 is such that element 51 extends and the amplitude of the applied electrical signal is increased, relative longitudinal movement of jaw elements 60 and 61 occurs in the directions of arrows 82a and 83a, respectively. If there is no slippage between the jaws and shaft 80, rotation of shaft 80 takes place in the direction of arrow 82a'. As the amplitude of the electrical signal across piezoelectric element 51 is reduced, piezoelectric element 51 contracts, causing longitudinal movement of jaw elements 60 and 61 in the directions of arrows 82b and 83b, respectively. Again assuming that no slippage occurs between the jaws and shaft 80, rotation of shaft 80 takes place in the direction of arrow 82b'.

Because of the inertia of the shaft 80, a rapidly rising or falling electrical signal will induce such rapid movement of the jaw elements 60 and 61 that slippage between the jaws and shaft 80 will occur. The duration of slippage depends on the waveform and amplitude of the electrical signal applied across the piezoelectric element 51, as well as the mechanical characteristics of the system, such as the frictional engagement between the jaws and shaft 80, the inertia of the shaft 80 and other mechanical elements connected to it, together with the frictional engagement between shaft 80 and the threaded hole in base plate 85.

Conversely, application of a slowly rising or falling signal across piezoelectric element 51 will cause a correspondingly slow longitudinal movement of the jaw elements 60 and 61, and very little or no slippage between the jaws and shaft 80 will take place.

It follows that selective rotation of shaft 80 may be obtained in either direction 82a or 82b simply by applying a cyclic electrical signal having the proper waveform and polarity. That is, a cyclic signal having a slowly rising waveform followed by a rapidly falling waveform will cause rotation in a first direction. Conversely, a cyclic signal having a rapidly rising waveform followed by a slowly falling waveform will be effective to rotate shaft 80 in the opposite direction. A more complete graphic and mathematical description of the waveform is provided in FIG. 18.

Figure 9:
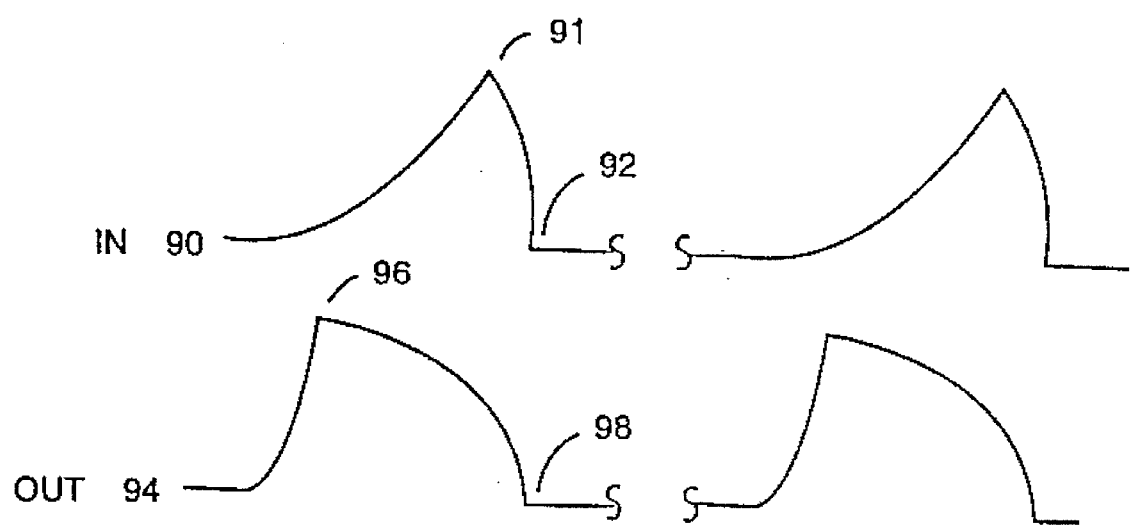
FIG. 9 illustrates the waveforms of the drive signals applied to the piezoelectric actuator to achieve rotation in a clockwise and counterclockwise direction.

In FIG. 9, the waveform beginning at 90 represents the electrical signal which produces rotation in the direction of arrow 82a'. It can be seen that the voltage, represented by the vertical axis, increases in the positive direction at a slowly increasing rate until the peak value at point 91 is reached. The voltage at this point represents the maximum value applied across piezoelectric element 51, and therefore, also the maximum length of element 51. Since the applied voltage has been increased slowly, no slippage has occurred between shaft 80 and jaw elements 60 and 61, and shaft 80 has rotated a short distance in the direction of arrow 82a'. The electrical signal then falls sharply as indicated by the portion of the waveform between the peak 91 and the minimum 92. The sharply falling signal causes jaw elements 60 and 61 to move quickly in the direction of arrows 60b and 61b. Since this movement is very rapid, the mechanical characteristics of the system, such as the inertia and frictional engagement of shaft 80, combine to prevent the shaft from following the jaw's longitudinal movement. Repetition of the waveform 90–92 in cyclic fashion causes incremental movement of shaft 80 in the direction of arrow 82a', which causes the adjustment screw to be driven in Rotation of shaft 80 in the direction of arrow 82b' is accomplished by the application of an electrical signal as represented by the waveform beginning at point 94. In this case, the relatively rapid increase of the applied voltage causes the piezoelectric element 51 to extend quite rapidly and induce rapid longitudinal motion between jaw elements 60 and 61 in the direction of arrows 82a and 83a. Since the motion is relatively rapid, there is slippage between shaft 80 and jaw elements 60 and 61, and no rotational motion of shaft 80 is created. The applied voltage increases to the maximum value at point 96, corresponding to the maximum length of piezoelectric element 50. The electrical signal then falls slowly, as shown by the portion of the waveform between points 96 and 98. Since the longitudinal movement of piezoelectric element 50 follows the applied voltage, the motion of jaw elements 60 and 61 is sufficiently slow such that the inertia and other mechanical characteristics of the system which prevented shaft 80 from following the jaw movement during the initial phase of the cycle (from point 94 to point 96) are overcome. Jaw elements 60 and 61 therefore remain in non-slipping engagement with shaft 80 during their longitudinal movement in the direction of arrows 82b and 83b, causing shaft 80 to rotate in the direction of arrow 82b', causing the adjustment screw to be driven out. Repetition of the waveforms 94–98 in cyclic fashion cause incremental rotation of shaft 80 in the direction of arrow 82b'.

It would be possible to produce rotational motion in either direction by the application of a linear waveform having a slowing changing and rapidly changing portions in the manner of a saw-tooth waveform. Such waveforms, while functional, do not provide optimal performance in terms of achieving the maximum speed of rotation since the maximum slope of the wave is limited to that which does not produce slippage at the onset of the signal, or, alternatively, a slope which is low enough to provide some engagement between the jaws and the shaft. Neither alternative provides optimum results. Ideally, the waveforms are not linear and take the shape indicated. To provide optimum performance of the system, the portion of the waveform which produces rotation in the desired direction should have a gradually increasing slope since this takes advantage of the shaft acceleration and produces the most rapid rotation in the desired direction. The waveform of the signal in the opposite direction should also have a gradually increasing slope to prevent the jaws from ultimately engaging the shaft in non-slipping relationship. However, since the duration of the portion of the signal which produces jaw movement in the undesired direction may be kept short without substantial prejudicial effects, it is not as critical that it also have a gradually increasing slope. From a practical standpoint, the rapidly rising or falling portion of the waveform is largely dependent on the capacitance of the piezoelectric element, and the slope can be made as great as possible with the selected circuit components. From the theoretical standpoint, it is desirable that the rapidly rising or falling portion of the waveform be at least four times faster than would result in any non-slipping engagement between jaw elements 60 and 61 and shaft 80. In like fashion, it has been found that the slowly rising or falling portion of the waveform be at least four times slower than would result in slipping engagement between jaw elements 60 and 61 with shaft 80. These margins accommodate changes in the system variables and ensure reliable operation over long periods of time.

The electronic circuity for generating the appropriate control and drive signals for the piezoelectric actuator shown in FIGS. 10–17 is designed to operate from a nominal 12 volt DC power source. The figures relating to the electronic circuits used with this invention employ a number of control signals. These signals are defined as follows:

CLK—This signal is the system clock. It is a 12 volt square wave having a nominal frequency of 1 kHz.

AIN—A 12 volt square wave synchronous with CLK. It is activated when adjustment screw 34 is to be driven clockwise.

BIN—A 12 volt square wave synchronous with CLK. It is activated when adjustment screw 36 is to be driven clockwise.

CIN—A 12 volt square wave synchronous with CLK. It is activated when adjustment screw 38 is to be driven clockwise.

AOUT—A 12 volt square wave synchronous with CLK. It is activated when adjustment screw 34 is to be driven counter-clockwise.

BOUT—A 12 volt square wave synchronous with CLK. It is activated when adjustment screw 36 is to be driven counter-clockwise.

COUT—A 12 volt square wave synchronous with CLK. It is activated when adjustment screw 38 is to be driven counter-clockwise.

PCA1, PCA2, . . . PCC1, PCC2—12 volt signals that control the amount of power extracted from the supply.

Figure 10:
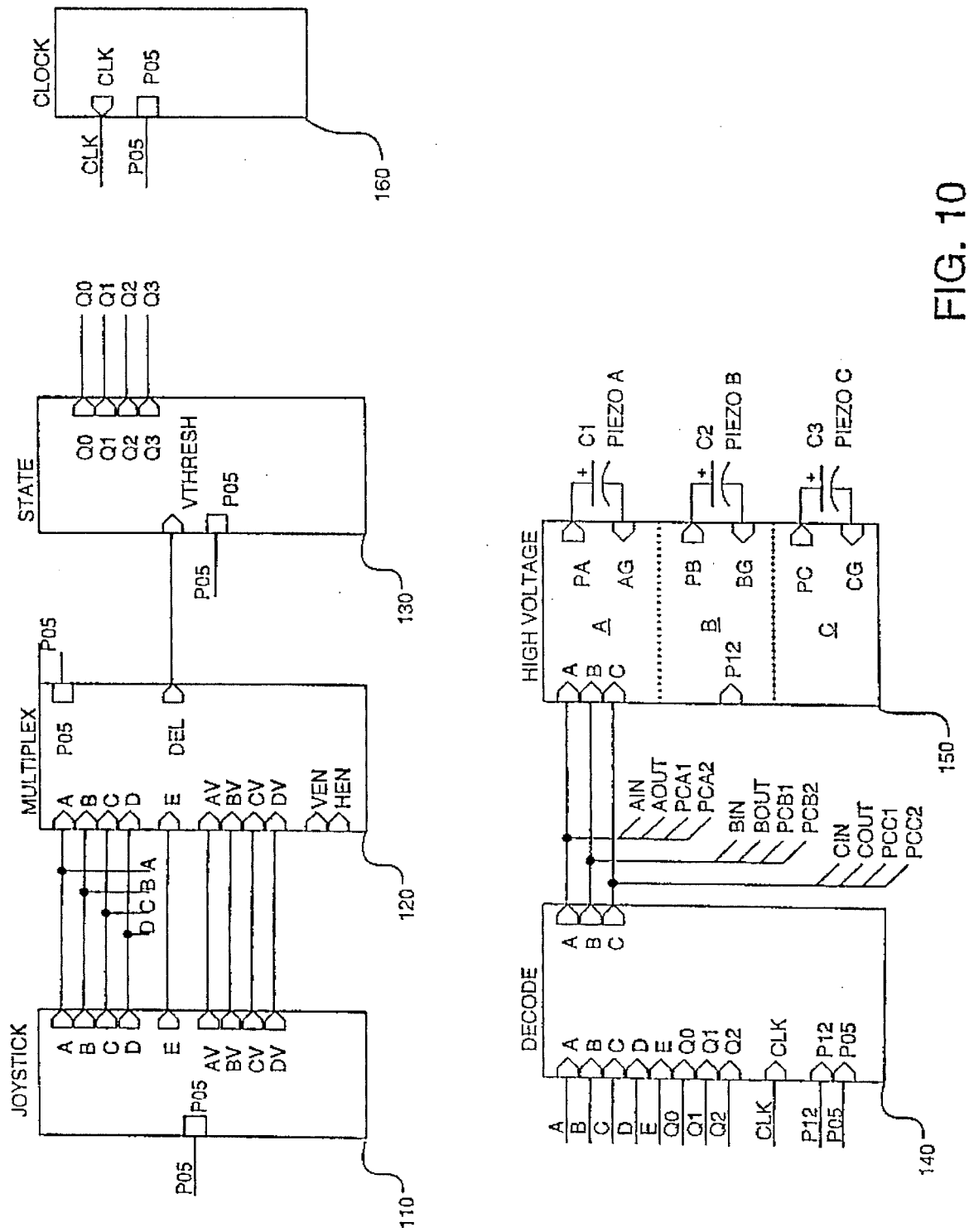
FIG. 10 is a schematic block diagram of the electronic system used to control the piezoelectric actuators.
Figure 11:
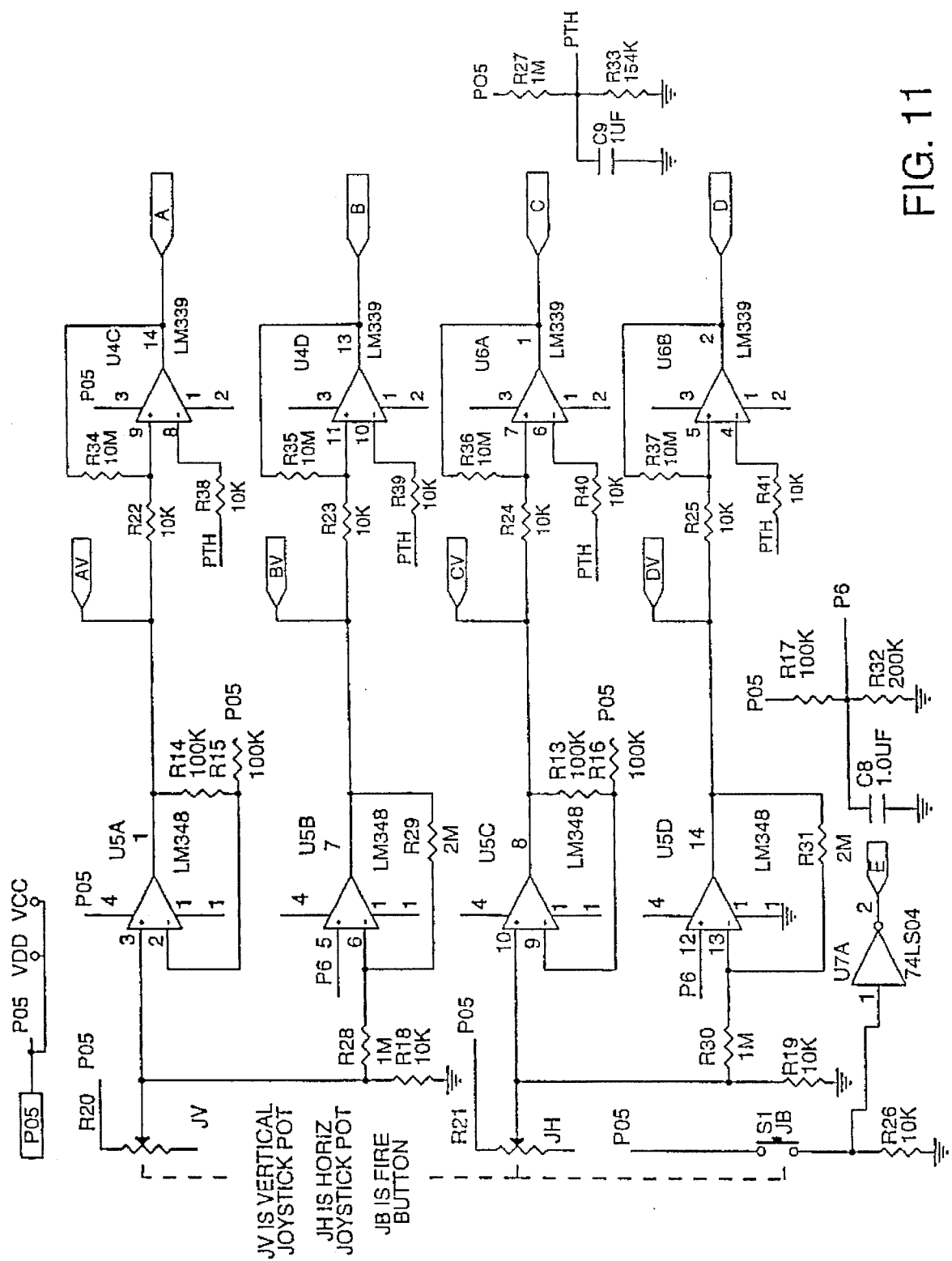
FIG. 11 is a detailed schematic diagram of the circuits associated with the joystick used to develop the control signals for the piezoelectric actuator.
Figure 12:
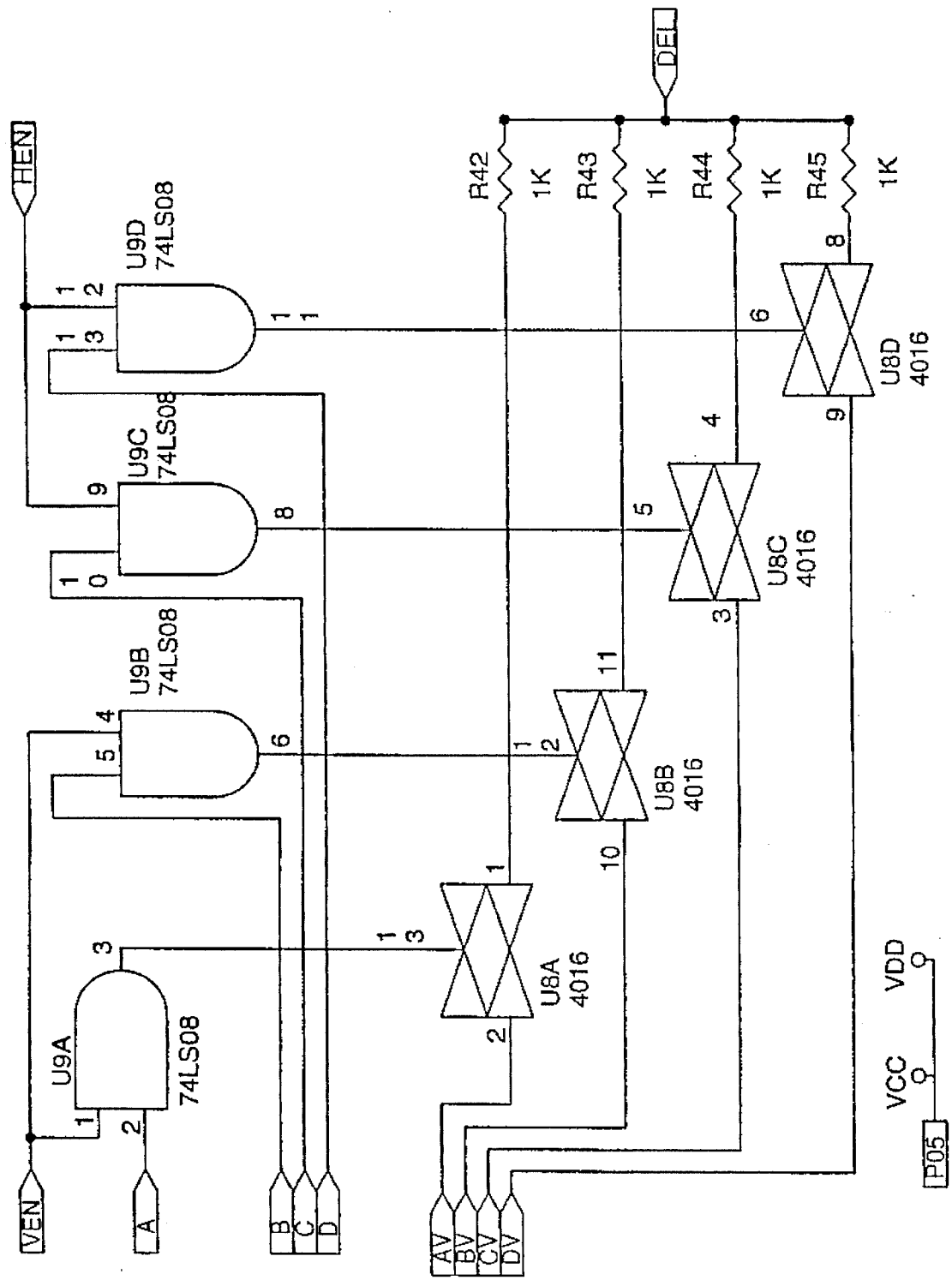
FIG. 12 is a detailed schematic diagram of the multiplex circuits.
Figure 13:
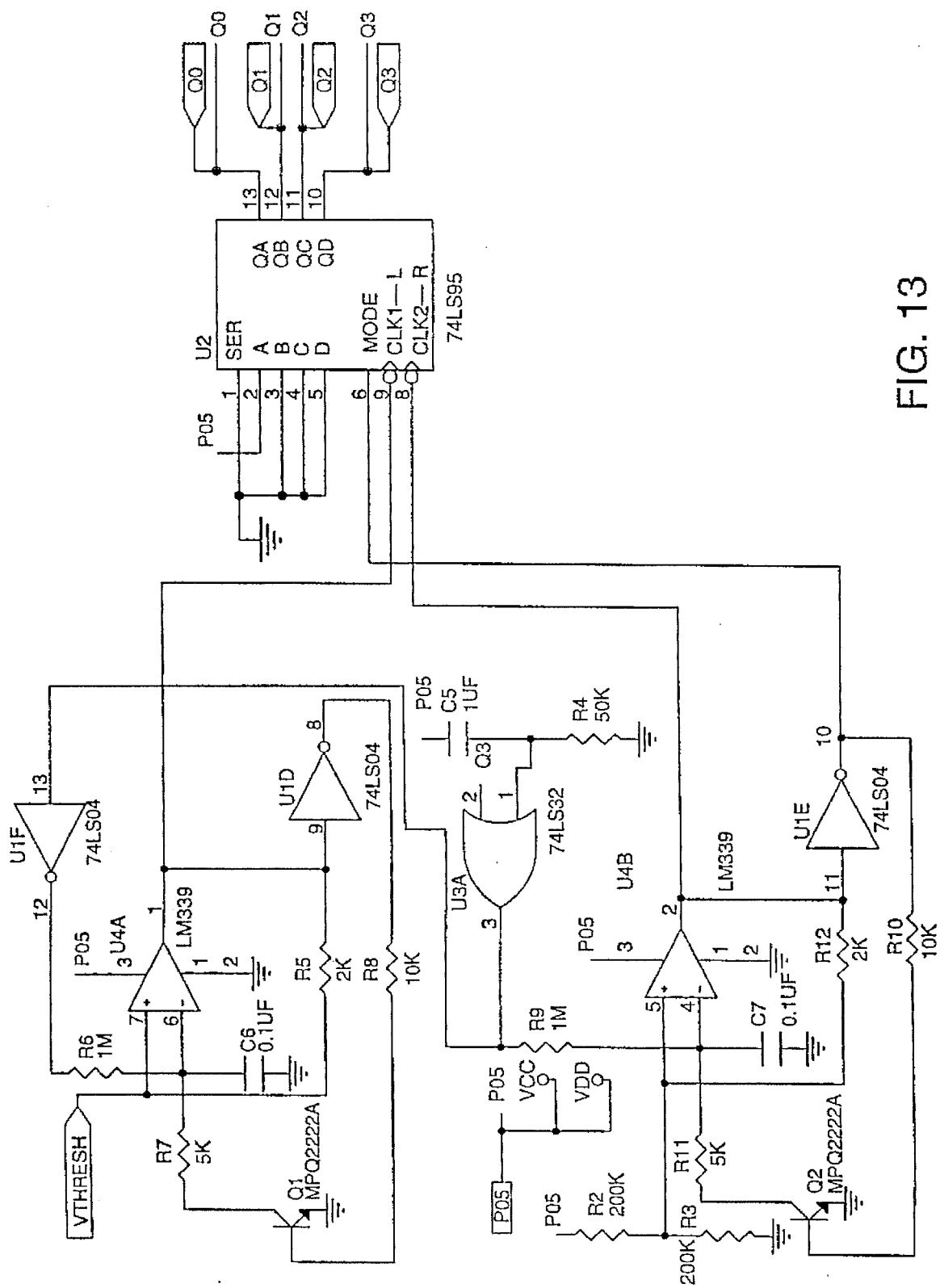
FIG. 13 is a detailed schematic diagram of the state circuits.
Figure 14A:
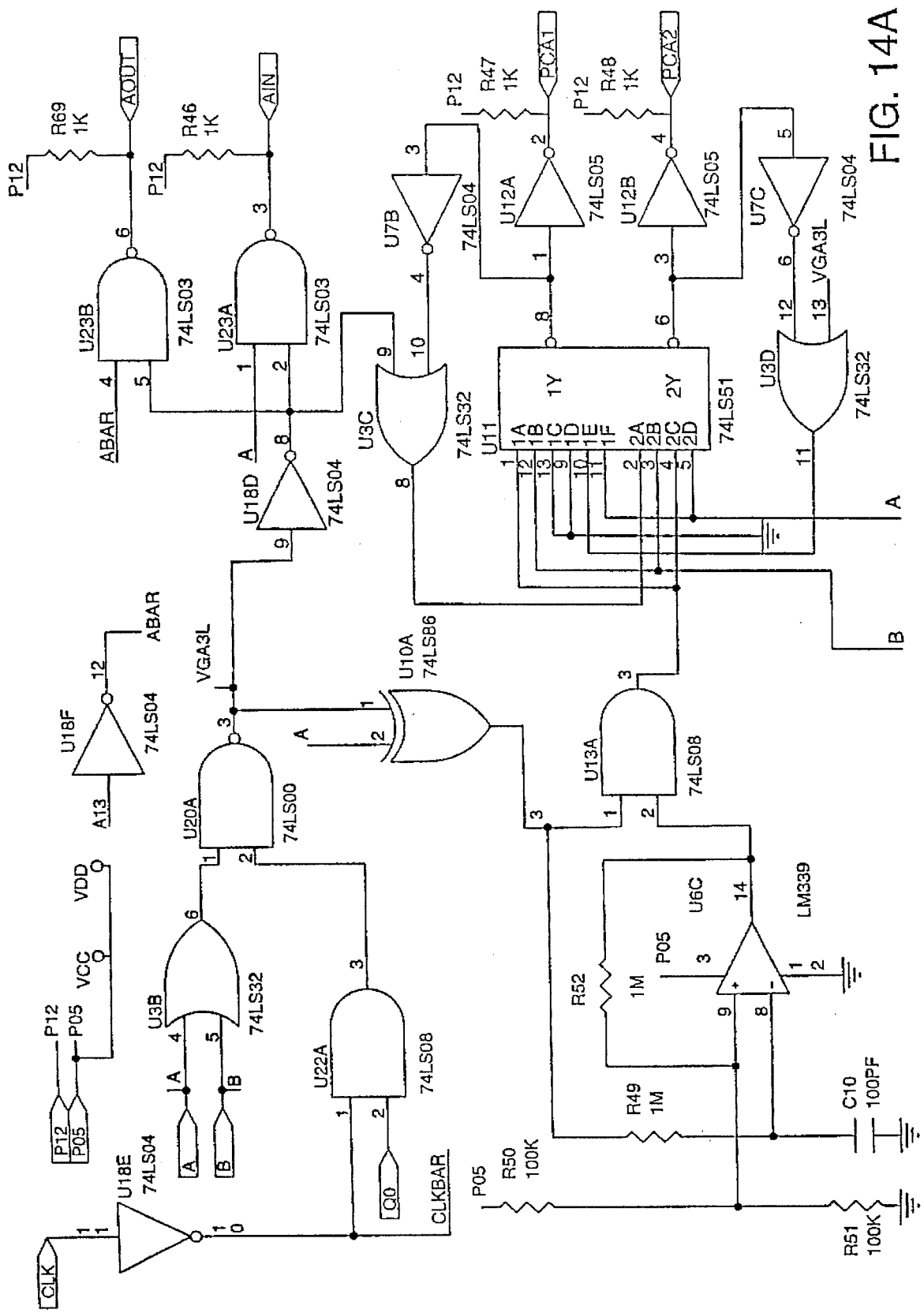
FIG. 14A–14C is a detailed schematic diagram of the decode circuits.
Figure 14B:
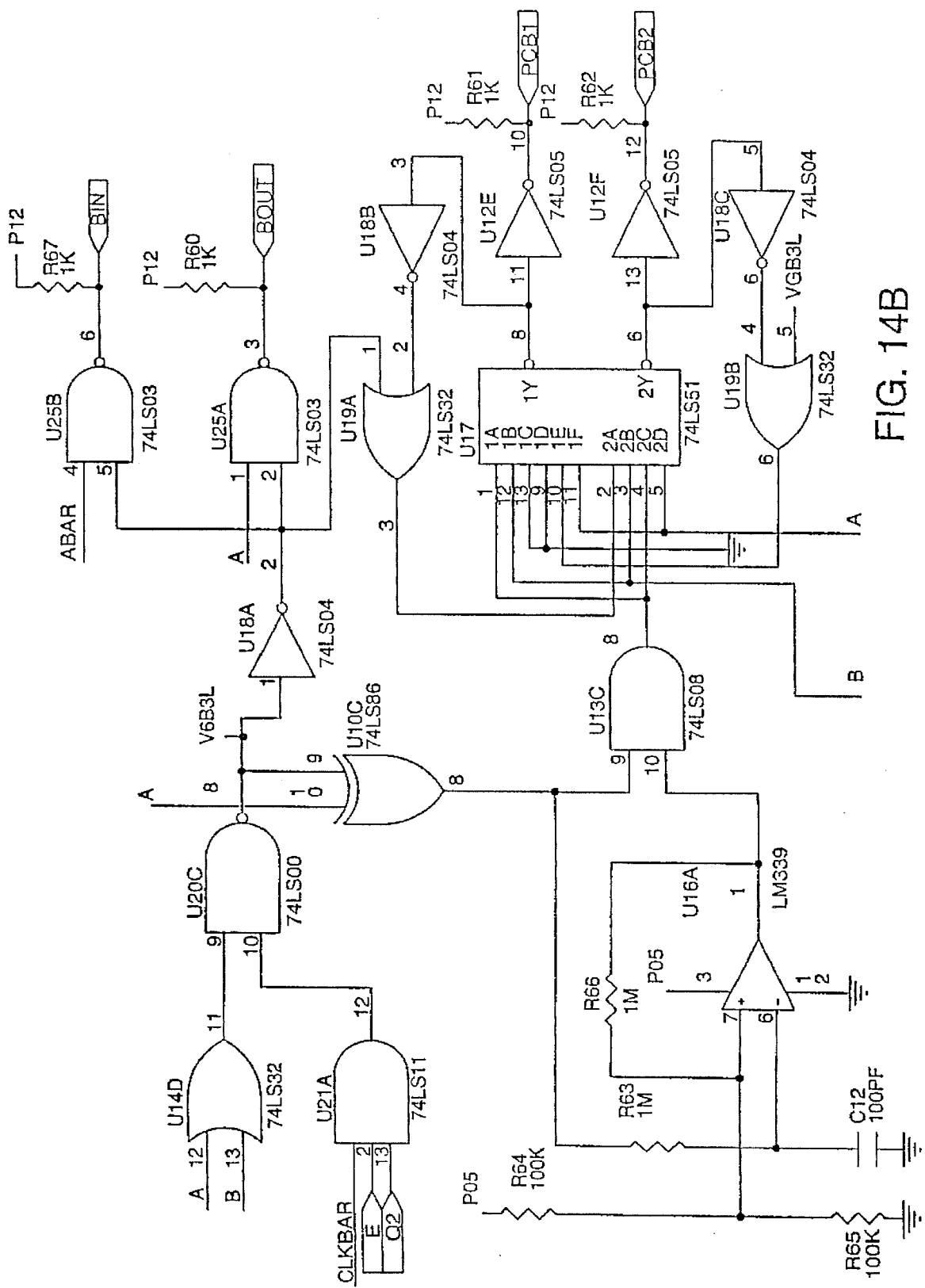
Figure 14C:
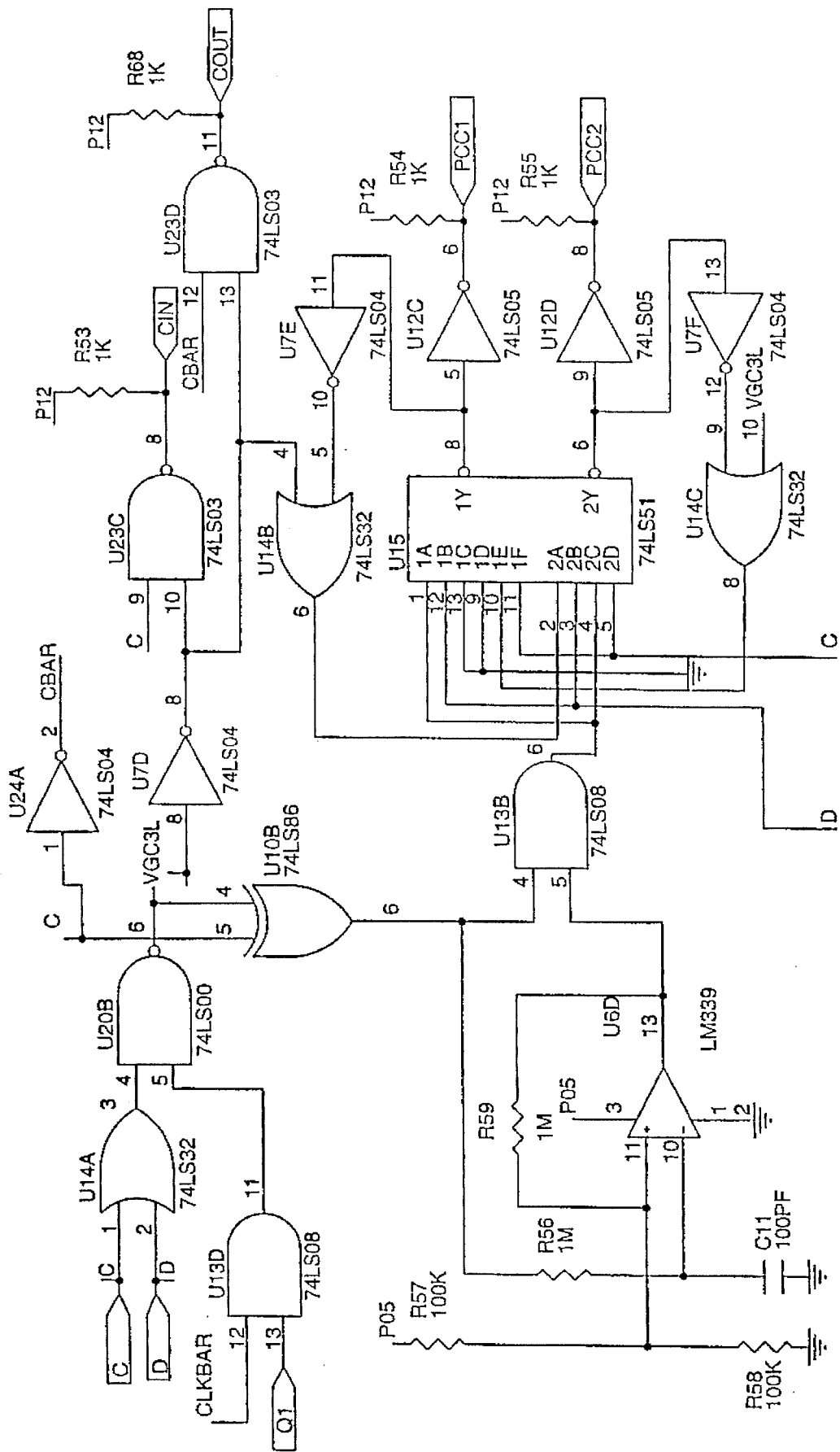

With reference to FIG. 10, the joystick block 110 includes a computer-type joystick which has a vertical motion potentiometer, a horizontal motion potentiometer and a "fire" button. The horizontal and vertical motion potentiometers associated with the joystick develop voltages which are used in block 110 to generate output signals AV, BV, CV, and DV, representing voltages proportional to the displacement of the joystick from the center, or neutral position. These signals are conventional but, by themselves, are not adequate for control of the piezoelectric actuators. The output signals A, B, C, and D are binary in nature, and, in response to the voltages by the potentiometers associated with the joystick, assume a high or low value depending on whether the joystick is in the neutral position or has been moved in the upward, downward, left or right directions, respectively.

Multiplex block 120 serves to combine the analog joystick output signals in a fashion which develops a signal on line DEL that controls the amount of time spent driving each of the three piezoelectric devices. For example, when driving adjustment screw 38, this block senses the magnitude of the horizontal joystick output and determines how long the piezoelectric device is connected and thereby also how many drive pulses it will receive.

State block 130 keeps track of which piezoelectric device is being driven. Decode block 140 translates the horizontal and vertical joystick output signals into three actuator screw control signals representing the direction and magnitude of the actuator screw movement necessary to follow the joystick command. The high voltage block responds to the actuator screw controls to generate the appropriate high voltage signals for energization of the appropriate piezoelectric actuator. The system clock signals are generated by block 160, which provides a system timing signal.

FIGS. 11–15 represent a detailed description of the functional blocks described above.

Figure 15:
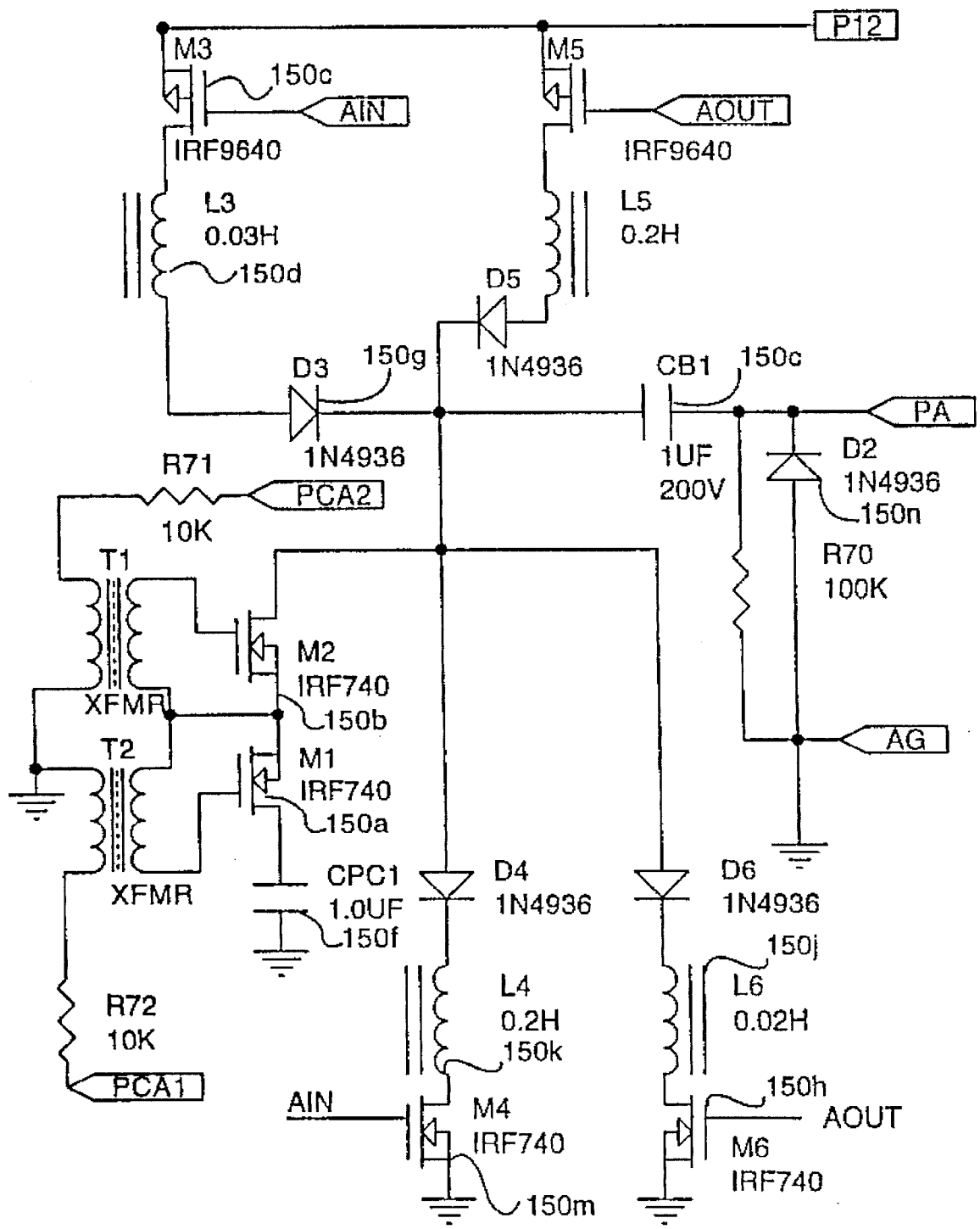
FIG. 15 is a detailed schematic diagram of the A portion of the high voltage circuits which is used to generate the drive signal to the A piezoelectric actuators.
Figure 17:
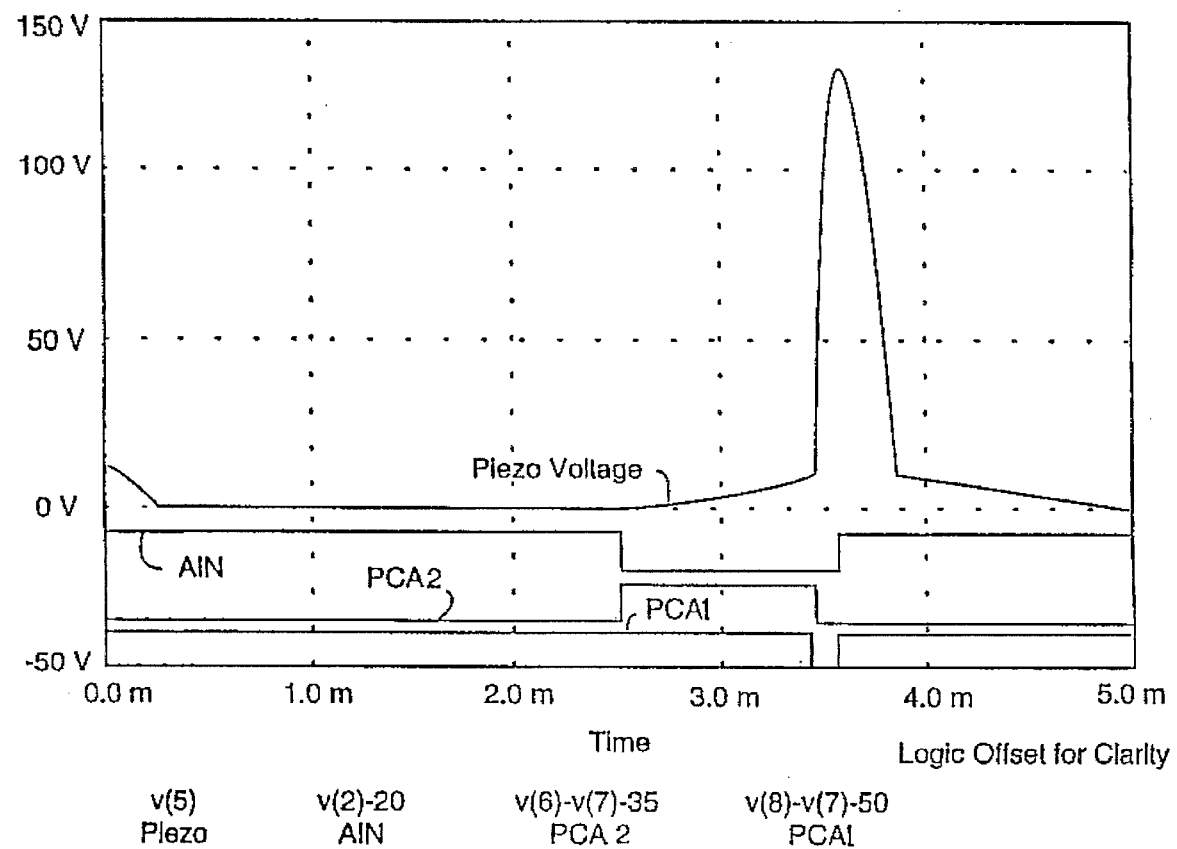
FIG. 17 is a timing diagram illustrating the relationship between the various signals used to generate a high voltage drive signal for a piezoelectric actuator.

FIG. 17 is a timing diagram which shows the relationship between AIN, PCA1 and PCA2 in the case where the joystick lever is pushed forward. MOSFET devices 150a, 150b and 150c of FIG. 15 are placed in the conductive state by the signals PCA1, PCA2 and AIN when the CLK signal swings downward. The current in the inductor 150d increases according to the expression $$I_{150d} = \frac{V^+}{L_{150d} W_0} \text{ SIN } W_0 t$$

where $V^+$ is the supply voltage, $$W_0 = \frac{1}{\sqrt{L_{150d} C_T}} , \quad C_T = C_{150f} + \frac{C_p C_{150e}}{C_p + C_{150e}}$$

$C_p$ is the capacitance of the piezoelectric device and $C_{150f}$ and $C_{150e}$ are both much larger than $C_p$.

At a point in time determined by the delay circuit portion of the decode circuit 140, both MOSFET devices 150a and 150b will turn off, causing the current stored in inductor 150d to be forced into the series circuit formed by capacitor 150e and the effective capacitance $C_p$ of the piezoelectric device. The time determined by the timing circuit is chosen to be $$t = \frac{\pi}{2W_0}$$

so the output voltage across the piezoelectric device will increase according to the expression $$V_0 = V^+ \sqrt{\frac{C_T}{C_p^1}} \text{SIN} W_0^1 (t - t_1)$$

where $$C_p^1 = \frac{C_p C_{150e}}{C_p + C_{150e}} \approx C_p$$

and $$W_0^1 = \frac{1}{\sqrt{L_{150d} C_p^1}}$$

Figure 18:
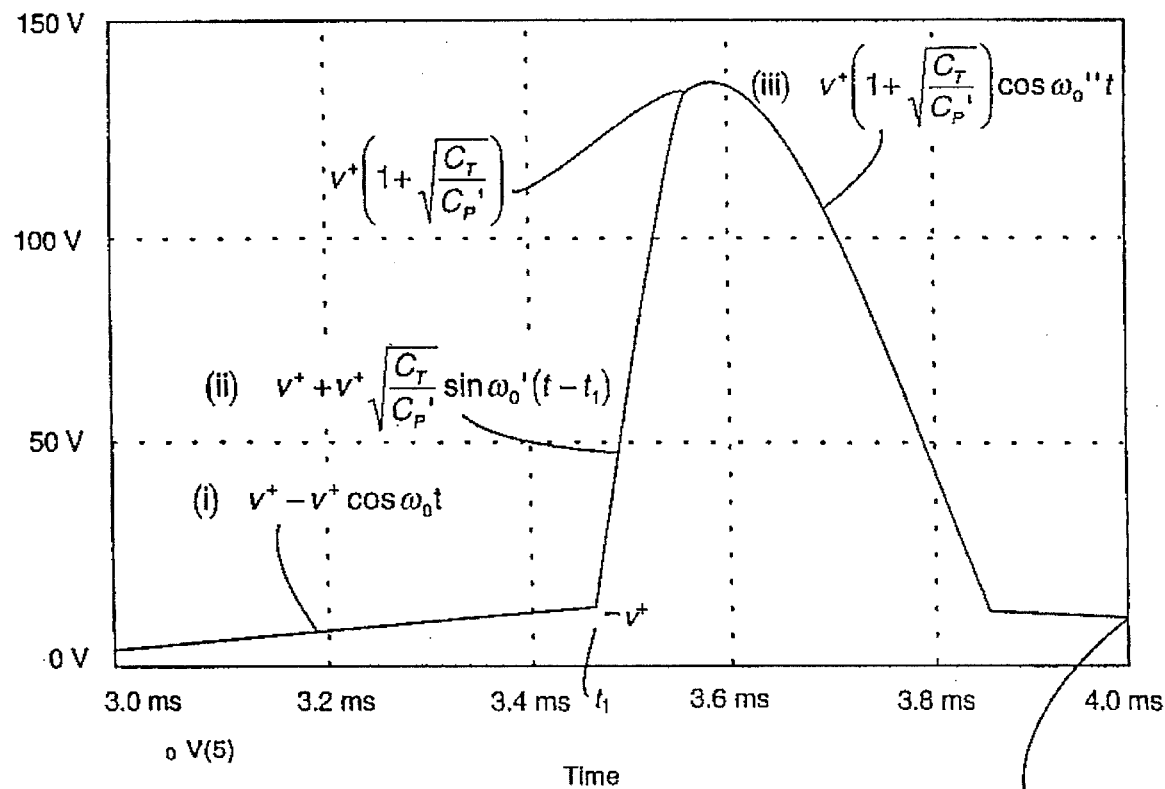
FIG. 18 is a waveform and mathematical expression of the drive signal applied to a piezoelectric actuator.

This is illustrated in graphic form by the portion of the curve ii in FIG. 18, beginning at the time $t_1$.

The voltage will stop increasing when the current in inductor 150d decays to zero and diode 150g becomes reverse biased. At this point the voltage across the piezoelectric device is $$V_0 = V^+ \left( 1 + \sqrt{\frac{C_T}{C_p^1}} \right)$$

For the case where $C_T = 100 C_p^1$, there is a voltage multiplication of 11. Since the abrupt change in voltage beginning at time t causes a corresponding abrupt change in velocity of the piezoelectric device, the jaws of the piezoelectric actuator slip on the threaded adjustment screw, and there is no rotary motion induced to the adjustment screw. At the peak of the waveform, the velocity of the piezoelectric device slows to the point where it does not slip. The jaws engage the adjustment screw in non-slipping fashion before the upswing of the CLK signal which causes MOSFET 150a and MOSFET 150h to conduct. At this point the voltage across the piezoelectric device is discharged to ground through inductor 150j. The energy which is not lost in parasitic resistances or work performed by the piezoelectric device is stored in the capacitance across the piezoelectric device in the form of a negative voltage. The value of inductor 150j is chosen to be approximately 10 times the inductance of inductor 150d so the downswing of the waveform, shown in FIG. 18 as the portion of the waveform iii, is held to a value slow enough to ensure non-slipping engagement of the piezoelectric actuator jaws and the threaded adjustment screw.

Rotational motion in the opposite direction is accomplished in similar fashion. However, since there is no negative supply voltage, a potential difference is created by first charging the capacitor 150f. It is then discharging through inductor 150k, with MOSFETS 150a, 150b and 150m conducting. MOSFETS 150a and 150b are then turned off which forces the current in inductor 150k to be pulled from the capacitance across the piezoelectric device. This drives the voltage across the piezoelectric device in the negative direction.

The piezoelectric device is protected against damage from reverse bias by the diode 150n and capacitor 150e, which will charge to create a bias that prevents the voltage across the piezoelectric device from going negative at any point in the steady state waveform.

Figure 16:
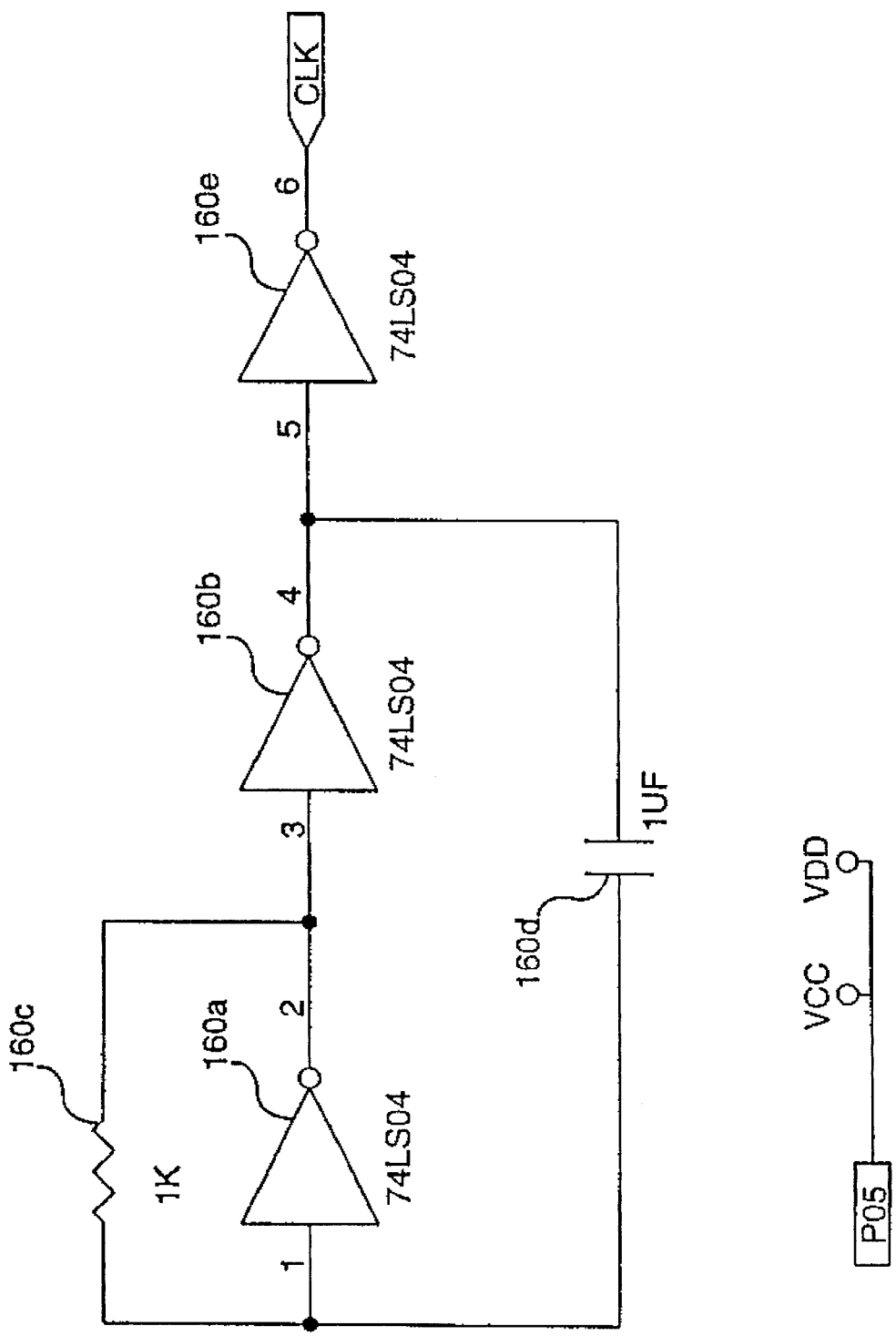
FIG. 16 is a detailed schematic diagram of the clock circuit.

FIG. 16 is a detailed diagram of the clock circuit which generates a system timing signal at a frequency approximating 1 kHz. The integrated circuit amplifier elements 160a and 160b are interconnected by means of resistor 160c and capacitor 160d to create an oscillator circuit. The amplifier element 160e serves as a buffer to isolate the output load from the frequency determining portion of the circuit.

ROTARY OPTICAL STAGE

The embodiment of the present invention in a rotary optical stage includes a piezoelectric element mounted in a frame member affixed to the base member of the rotary stage. The piezoelectric element has a first end which fits into a receptor portion of the frame member and second end to which is affixed a drive pad. The drive pad has a drive portion for frictional engagement with the rotatable portion of the rotary stage. The drive pad also includes a portion for retention of a bias spring which serves both to urge the drive portion into engagement with the movable portion of the rotary stage and to hold the piezoelectric actuator in place. The piezoelectric element is operative to effect reciprocating motion of the drive pad. The reciprocating motion of the drive pad developed by the piezoelectric element is converted to rotary motion of the optical stage by moving the drive pad relatively slowly in a first direction such that the coefficient of friction between the drive pad and the rotatable optical stage overcomes the inertial and rotational friction of the rotatable optical stage, causing the movable optical stage to rotate slightly. The electrical drive signal is configured to maintain engagement between the drive pad and the rotatable optical stage to incrementally rotate the optical stage. When the limit of extension of the piezoelectric element is reached, the electrical drive signal is shifted to cause rapid movement of the drive pad in a second, opposite direction such that the inertial characteristics of the rotatable optical stage prevents the rotatable stage from following the drive pad motion and the drive pad slips against the rotatable optical stage, thereby preserving the incremental rotation of the optical stage. The result is a stepwise rotation of the optical stage. Rotational motion of the optical stage in the opposite direction is accomplished by simply interchanging the characteristics of the motion in the first and second directions.

Figure 19:
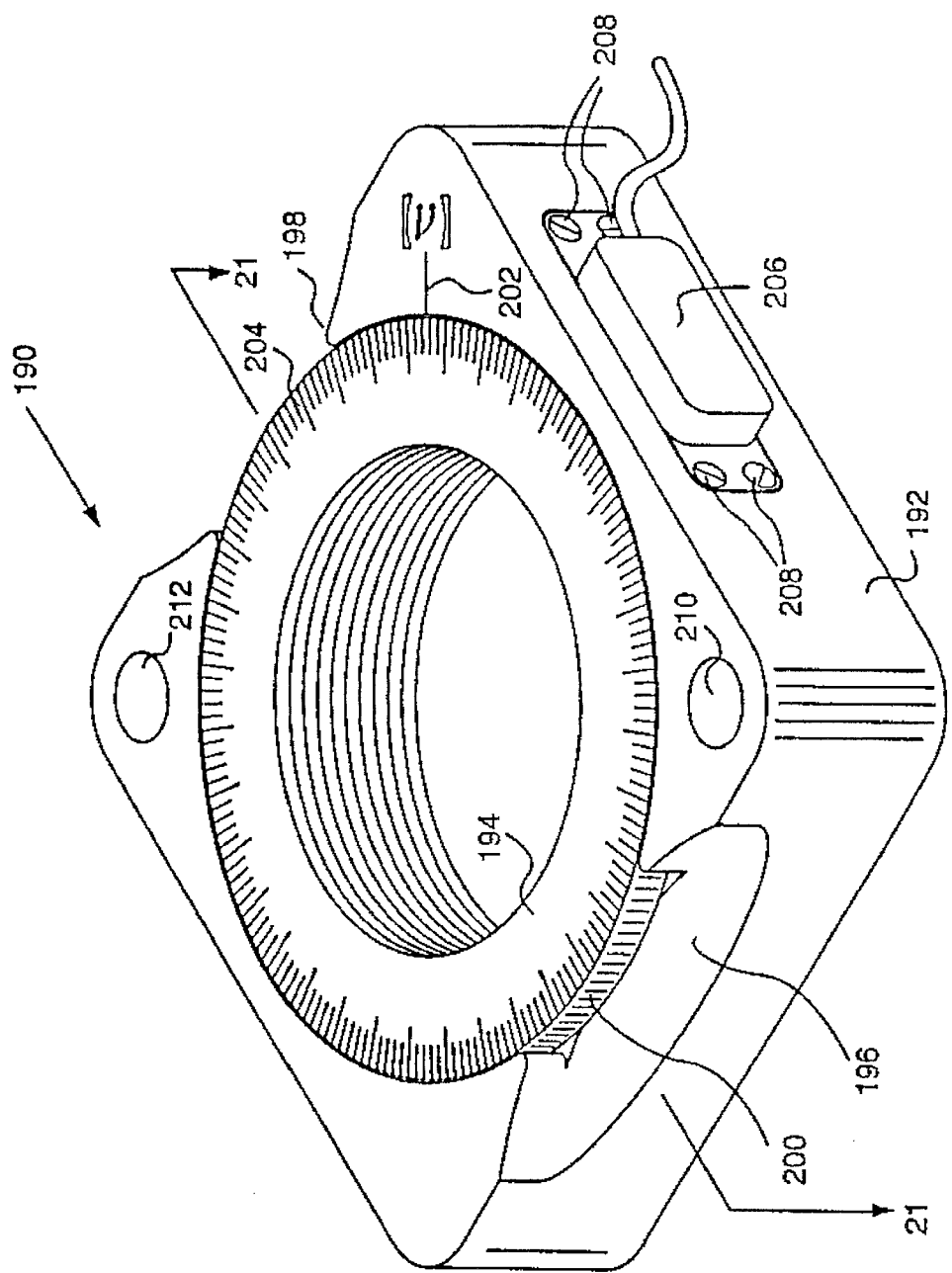
FIG. 19 is an isometric view of a rotary optical stage incorporating the invention.

With reference to FIG. 19, the rotatable optical stage 190 includes a base member 192 which supports a rotatable stage member 194 to which may be affixed an optical element such as a diffraction grating, mirror, polarizer, or similar device. Cut out portions 196 and 198 in base member 192 allow the rotatable stage member 194 to be grasped by hand for manual rotation. Knurled portion 200 at the upper periphery of stage member 194 facilitates the manual adjustment operation. An index mark 202 on the top of base member 192 may be used in conjunction with scale 204 on the top of rotatable stage member 194 to achieve a coarse initial position. A combination cover and frame element 206 is secured to base member 192 by suitable means such as screws 208.

Holes 210 and 212 accommodate conventional optical mounting hardware used to secure base member 192 to an optical bench or other optical system support.

Figure 20:
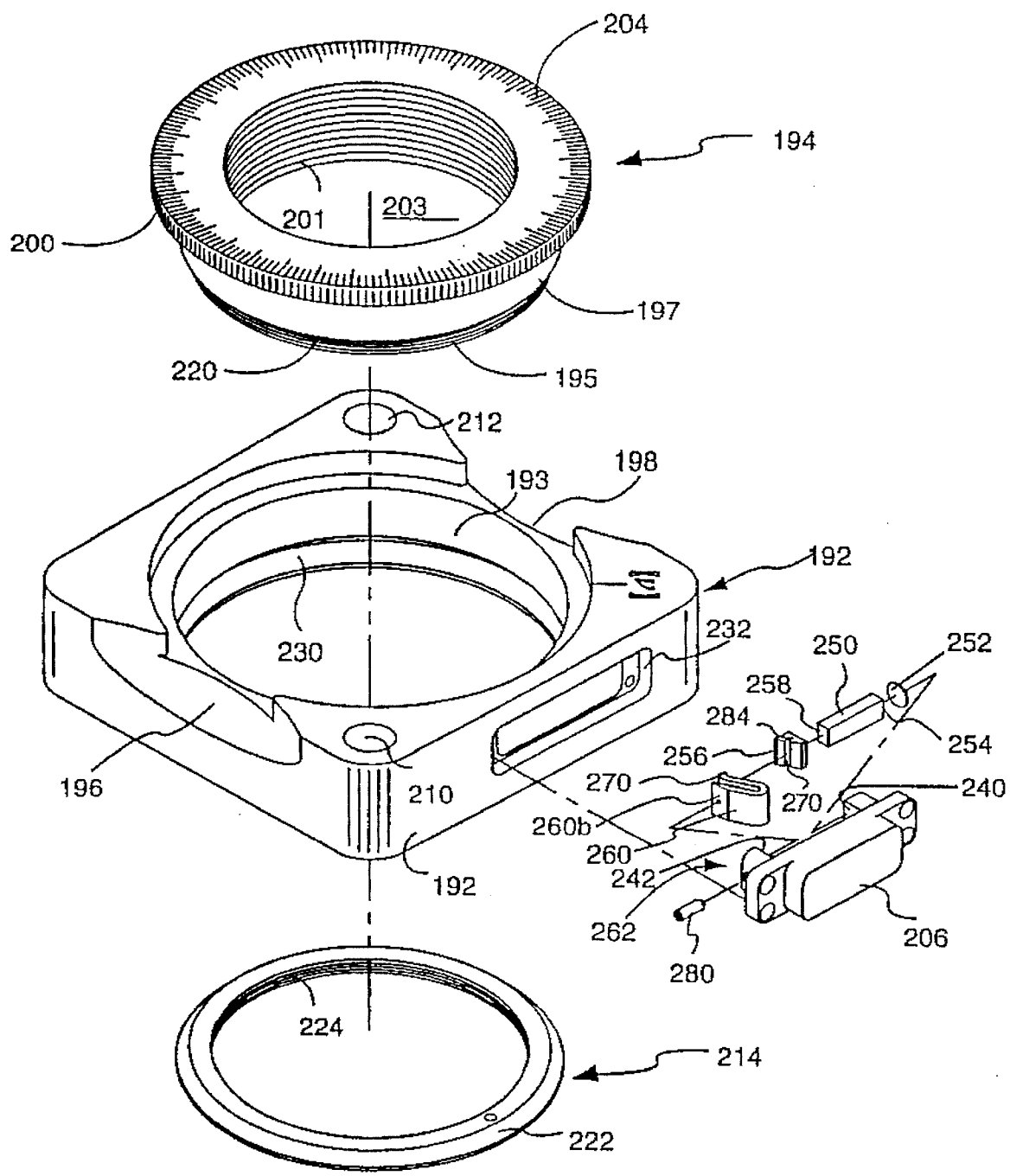
FIG. 20 is an exploded view of the rotary optical stage shown in FIG. 19.
Figure 21:
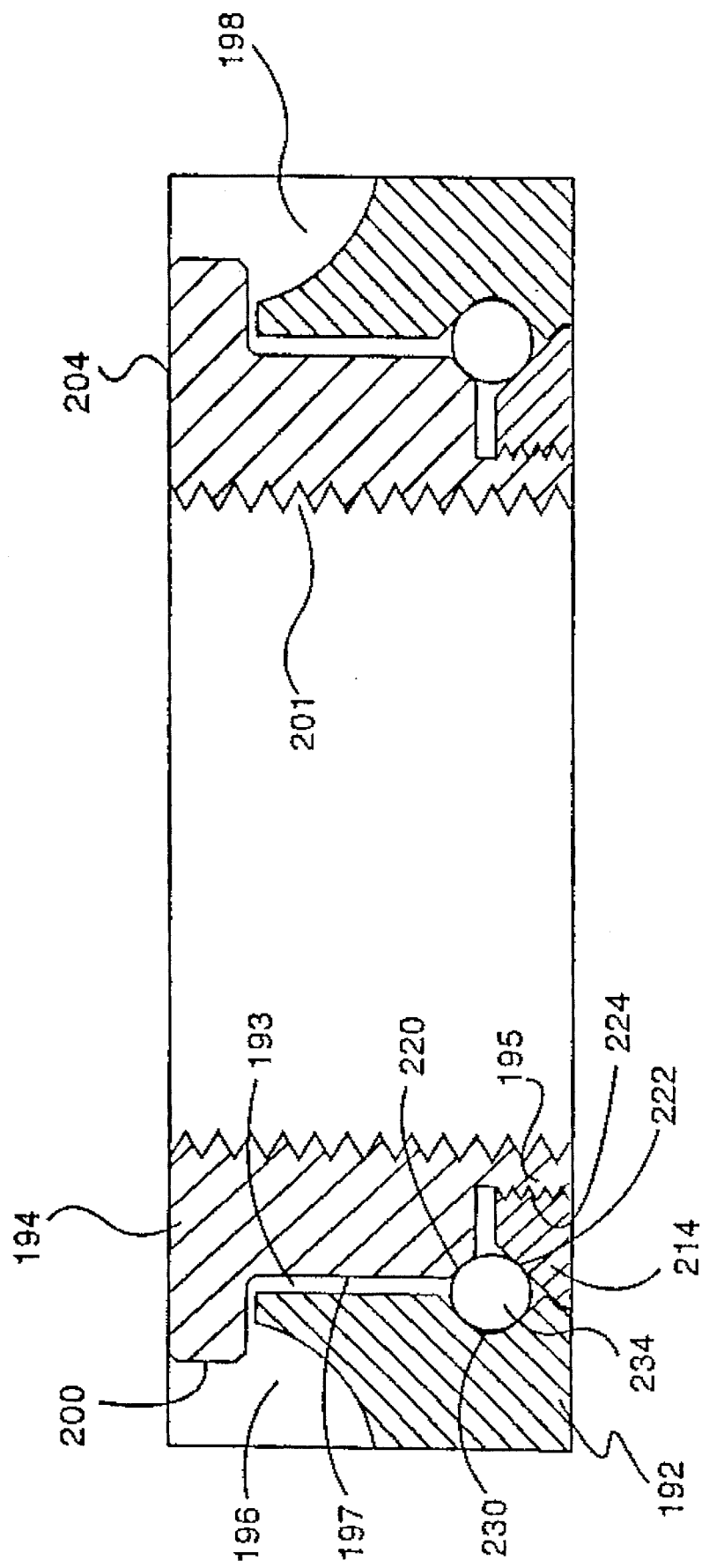
FIG. 21 is a sectional view of the rotary optical stage taken along the line 21—21 of FIG. 19.

FIG. 20 is an exploded partial view of the rotatable optical stage 190 shown in FIG. 19. The stainless steel rotatable stage member 194 has a complementary stainless steel lower member 214 each of which screwingly secure to each other. The rotatable stage member 194 includes outer surface threads 195 aligned beneath the outer cylindrical drive surface 197 as also illustrated in FIG. 21. The outer surface threads 195 of the rotatable stage member 194 screwingly engage threads 224 in the interior of the lower circular member 214. Internal threads 201 are located on the walls of aperture 203 of the rotatable stage member 194 to accommodate an optic or other device. Upper stage member 194 and lower member 214 have beveled bearing races 220 and 222 respectively which combine with a complementary race 230 in the base member 192 to provide a high precision, low friction ball bearing arrangement for accommodation of ball bearings 234 of FIG. 21 for rotation of stage member 194.

Figure 22:
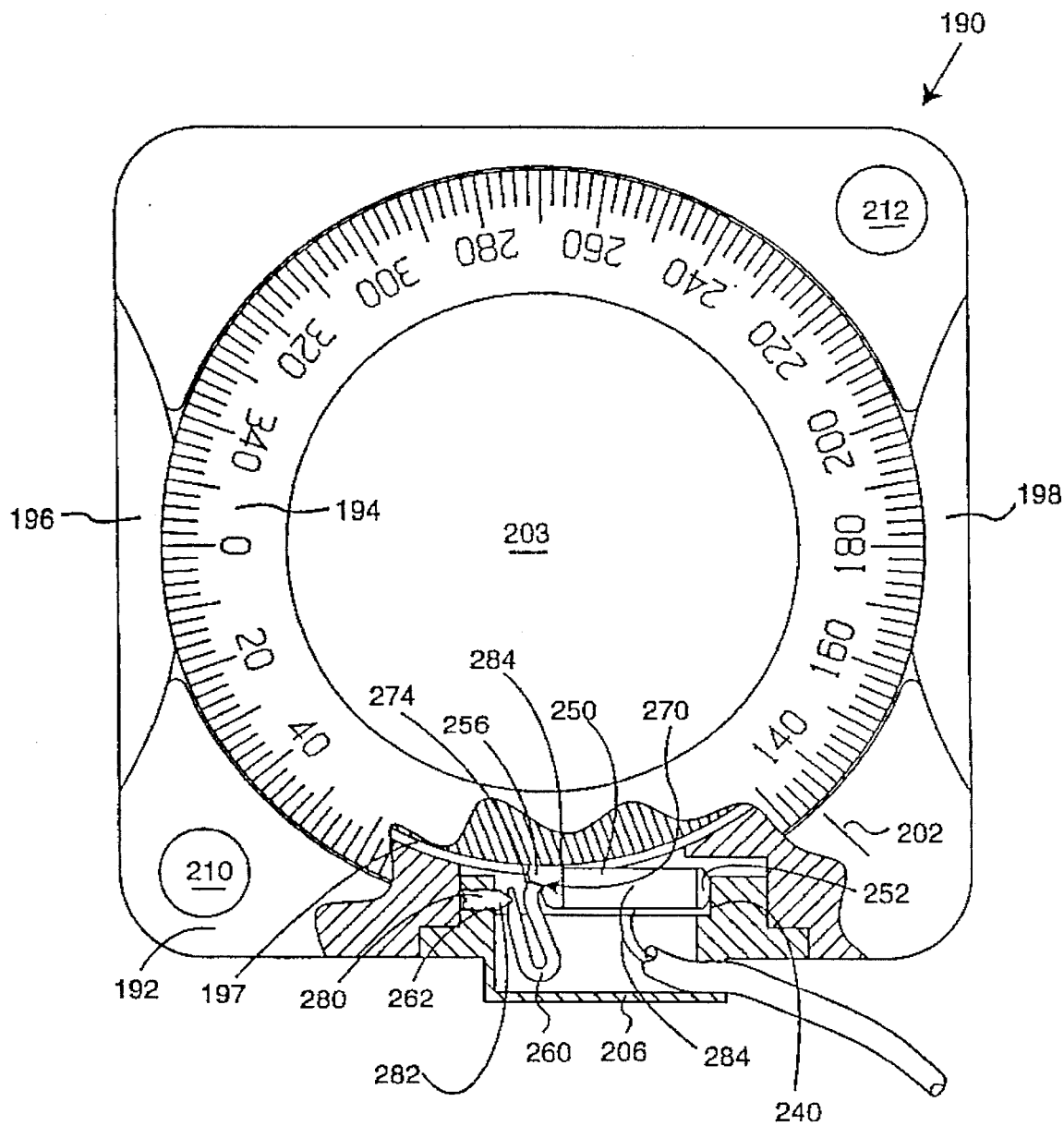
FIG. 22 is a top view, with parts cut away, of the rotary optical stage shown in FIG. 19.
Figure 23:
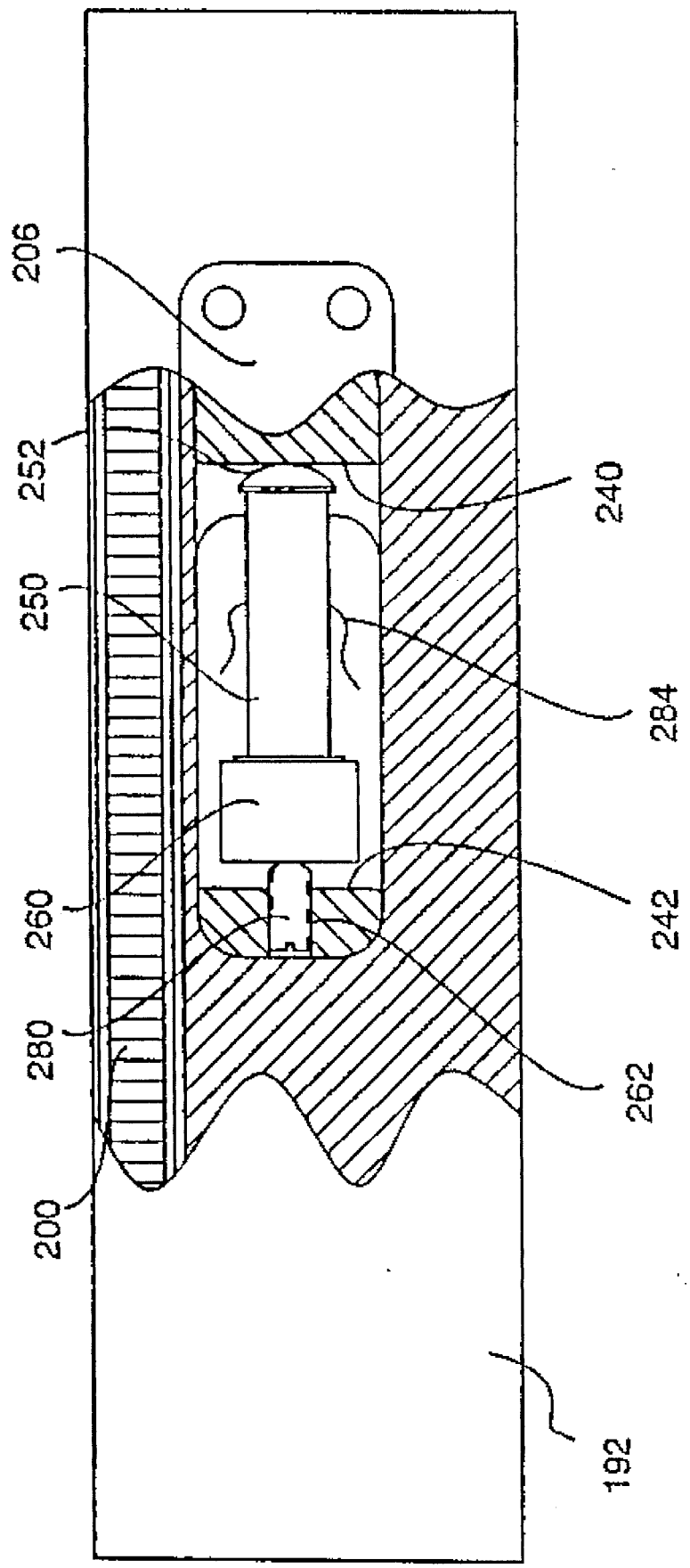
FIG. 23 is a side view of the rotary optical stage shown in FIG. 19, with parts cut away to show the side view of the piezoelectric actuator utilized to rotate the optical stage and, FIG. 24 illustrates an isometric view of a magnetostrictive actuator.

An actuator cut-out 232 in base member 192 accommodates a piezoelectric cover and frame element 206 having first and second opposing faces 240 and 242. The piezoelectric element 250 has a spherical cap 252 on a first end portion 254 and a brass drive pad 256 on a second end portion 258. Spherical cap 252 and drive pad 256 may be affixed to piezoelectric element 250 by suitable adhesive such as epoxy. Bias spring 260 fits between drive pad 256 and second frame opposing face 242 and is held in position by bias spring adjustment screw 280, as shown in FIGS. 22 and 23. Thread adjustment screw 280 aligns in a screw mount hole 262 in the structure having face 242 and aligns against surface 260b of the bias spring 260.

The sectional view of FIG. 21 illustrates the fashion in which the beveled bearing race 220 on stage member 194 and beveled bearing race 222 on lower member 214 combine with the V-shaped race 230 on the interior of base member 192 to form pair of V-shaped races which retain the ball bearings 234. Stage member 194 and lower member 214 are held in threaded engagement by complementary threaded portions 195 and 224.

FIG. 22 is a plan view of the rotatable optical stage with the portion of base member 192 cut away in the region of the piezoelectric actuator 250 which is shown in partial sectional view. The spherical cap 252 bears against the first opposing face 240 of the cover and frame element 206 and allows motion of piezoelectric element 250 to accommodate runout of stage member 194. The drive pad 256 has a bias spring retention means slot 270 which accepts the tapered 274 end of bias spring 260. A bias spring adjustment screw 280 has a tapered point 282 and engages in the screw mount hole 262 to engage one end of the bias spring 260.

Bias spring 260 is positioned to force drive portion 284 of drive pad 256 into engagement with the cylindrical drive surface portion 197 of rotatable stage member 194 and simultaneously force spherical cap 252 of piezoelectric element 250 against frame element face 240. Piezoelectric element 250 has a pair of drive signal lead wires 284 connected to the piezoelectric element 250.

FIG. 23 is a side view of base member 192 with parts cut away and a portion of frame element 206 in section to show the arrangement of bias spring 260 and bias spring adjustment screw 280.

ALTERNATIVE EMBODIMENT

Figure 24:
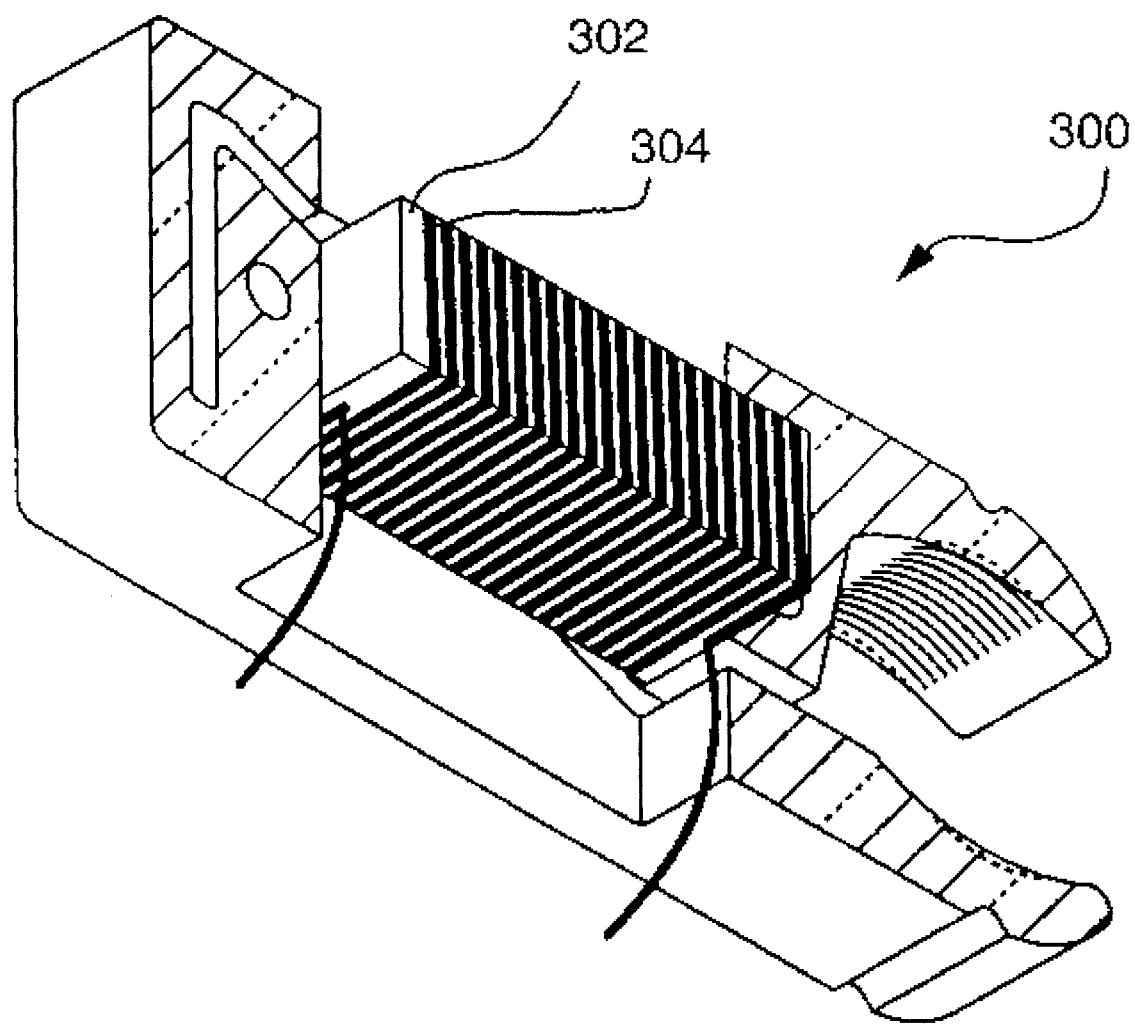

FIG. 24 illustrates an isometric view of a magnetostrictive actuator. The magnetostrictive actuator 300 utilizes magnetostrictive material 302 surrounded by a coil 304 for exciting the material similarly as previously discussed for the piezoelectric actuator. This provides for operation and functioning at low temperature and cryogenic temperatures at precision movements. The magnetostrictive material can be, for example, nickel alloy or tripiumdysprosium or its alloys.

MODE OF OPERATION

The drive signal applied to the drive signal lead wires 284 may be taken from the terminal PA and AG shown in FIG. 10. In this case, movement of the joystick to the upper position causes the rotatable stage member to rotate in one direction and movement of the joystick to the lower position causes the rotatable stage to rotate in the opposite direction. Alternatively, a single potentiometer may be used to control rotation. Of course it is possible to generate the necessary drive signals directly from the joystick vertical potentiometer without the need for the combinatorial circuitry necessary for the three drive arrangement since only one actuator is to be driven.

Various modifications can be made to the present invention without departing from the apparent scope hereof.

I claim:

1. A magnetostrictive actuator for bi-directional movement of a movable stage comprising:
   a. a fixed frame element having first and second opposing faces;
   b. an elongate magnetostrictive element having a first and second end portions;
   c. said first face bearing against said first end portion of said magnetostrictive element;
   d. a drive pad affixed to said second end portion;
   e. said drive pad having a retention means portion;
   f. said drive pad additionally having a drive portion for frictional engagement with said movable stage; and,
   g. spring bias means positioned between said second face and said drive pad retention means portion to urge said drive pad against said movable stage and to bias and retain said magnetostrictive actuator in position against said first face.

2. The device according to claim 1 wherein said movable stage is a rotary optical stage.

3. The device according to claim 2 wherein said drive portion of said drive pad engages the periphery of a cylindrical element drive portion of said rotary stage.

4. The device according to claim 3 wherein said drive portion of said drive pad has a flat to concave shape having a diameter matching the diameter of said cylindrical element drive portion of said rotary stage.

5. The device according to claim 4 wherein the frictional engagement between said drive pad and a circular element portion due to said spring bias means allows said drive pad to slip against said cylindrical element drive portion when said magnetostrictive actuator is driven with an electrical signal causing rapid physical dimensional change of said magnetostrictive element and prevents said drive pad from slipping against said circular element when said magnetostrictive actuator is driven with an electrical signal causing slow physical dimensional change of said magnetostrictive element.

6. The device according to claim 5 further including;
   a. drive means, responsive to a control signal, for generating and applying an electrical drive signal to said magnetostrictive element; and,
   b. said electrical drive signal having a first portion for effecting a first dimensional change of said magnetostrictive element and a second portion for effecting a second dimensional change of said magnetostrictive element to produce reciprocating motion of said drive pad relative to said frame element in a direction generally tangential to the circular periphery of said cylindrical element drive portion of said rotary stage.

7. The device according to claim 6 wherein said drive means further includes;
   acceleration and velocity control means for controlling said first dimensional change to provide a lower acceleration and velocity which maintains nonslipping engagement between said drive pad and said cylindrical element drive portion and for controlling said second dimensional change to provide for a higher acceleration and velocity which causes said drive pad to slip against said cylindrical element drive portion due to the inertia of said rotary stage whereby said rotary stage may be driven in a first rotational direction.

8. The device according to claim 7 wherein said drive means further includes;

means responsive to a control signal for interchanging the relative accelerations and velocities of said first and second dimensional changes whereby the frictional engagement of the drive pad with said cylindrical element drive portion, the bias force urging said drive pad against said movable stage, the inertia and rotational friction of said movable stage and the accelerations and velocities of said first and second dimensional changes provide non-slipping engagement between said drive pad and said movable stage during the relatively slower first dimensional change of said magnetostrictive element and slipping engagement between said drive pad and said movable stage during the relatively faster second dimensional change of said magnetostrictive element allowing rotational motion of said stage to be reversed by interchanging the relative accelerations and velocities of said first and second dimensional changes.

9. A magnetostrictive operated optical stage comprising:

a. a movable stage member adapted to support an optical element;

b. a fixed frame element, adjacent said movable stage member, having first and second opposing faces;

c. an elongate magnetostrictive element having a first and second end portions;

d. said first face bearing against said first end portion of said magnetostrictive element;

e. a drive pad affixed to said second end portion;

f. a bias spring retention means portion of said drive pad;

g. a drive portion of said drive pad for frictional engagement with said movable stage; and, h. bias spring means positioned between said second face and said bias spring retention means portion to urge said drive pad against said movable stage and to bias and retain said magnetostrictive actuator in position against said first face and said movable stage.

10. The optical stage according to claim 9 wherein;

a. said bias spring means urges said drive pad against said movable stage with a force sufficient to hold said drive pad in non-slipping engagement with said movable stage when said magnetostrictive element is energized with a slowly changing electrical signal and to allow said drive pad to slip against said movable stage when said magnetostrictive element is energized with a rapidly changing signal.

11. The optical stage according to claim 10 wherein;

a. said bias spring means urges said drive pad against said movable stage with a force sufficient to restrain said movable stage.

12. The optical stage according to claim 11 wherein;

a. said force permits manual movement of said movable stage.

13. The optical stage according to claim 9 wherein said movable stage provides for rotary motion.

14. The optical stage according to claim 13 wherein said drive portion of said drive pad engages the periphery of a cylindrical element drive portion of said movable stage member.

15. The optical stage according to claim 14 wherein said drive portion of said drive pad has a flat to concave shape having a diameter matching the diameter of said cylindrical element drive portion of said movable stage member.

16. The device according to claim 15 wherein the frictional engagement between said drive pad and a circular element portion due to said spring bias means allows said drive pad to slip against said cylindrical element drive portion when said magnetostrictive actuator is driven with an electrical signal causing rapid physical dimensional change of said magnetostrictive element and prevents said drive pad from slipping against said cylindrical element drive portion when said magnetostrictive actuator is driven with an electrical signal causing slow physical dimensional change of said magnetostrictive element.

17. The device according to claim 16 further including;

a. drive means, responsive to a control signal, for generating and applying an electrical drive signal to said magnetostrictive element; and, b. said electrical drive signal having a first portion for effecting a first dimensional change of said magnetostrictive element and a second portion for effecting a second dimensional change of said magnetostrictive element to produce reciprocating motion of said drive pad relative to said frame element in a direction generally tangential to the circular periphery of said cylindrical element drive portion of said rotary stage.

18. The device according to claim 17 wherein said drive means further includes;

acceleration and velocity control means for controlling said first dimensional change to provide a lower acceleration and velocity which maintains nonslipping engagement between said drive pad and said cylindrical element drive portion and for controlling said second dimensional change to provide for a higher acceleration and velocity which causes said drive pad to slip against said cylindrical element drive portion due to the inertia of said rotary stage whereby said rotary stage may be driven in a first rotational direction.

19. The device according to claim 18 wherein said drive means further includes;

means responsive to a control signal for interchanging the relative accelerations and velocities of said first and second dimensional changes whereby the frictional engagement of the drive pad with said cylindrical element drive portion, the bias force urging said drive pad against said movable stage, the inertia and rotational friction of said movable stage and the accelerations and velocities of said first and second dimensional changes provide non-slipping engagement between said drive pad and said movable stage during the relatively slower first dimensional change of said magnetostrictive element and slipping engagement between said drive pad and said movable stage during the relatively faster second dimensional change of said magnetostrictive element allowing rotational motion of said stage to be reversed by interchanging the relative accelerations and velocities of said first and second dimensional changes.

* * * * *